(12) United States Patent
Morimoto et al.

(10) Patent No.: US 6,495,384 B1
(45) Date of Patent: Dec. 17, 2002

(54) METHOD FOR MANUFACTURING DIFFRACTION GRATING AND METHOD FOR MANUFACTURING SEMICONDUCTOR LASER

(75) Inventors: Takao Morimoto, Tokyo (JP); Yoshiharu Muroya, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/428,791

(22) Filed: Oct. 28, 1999

(30) Foreign Application Priority Data

Oct. 29, 1998 (JP) .............................. 10-309124

(51) Int. Cl.[7] .............................................. H01L 21/27
(52) U.S. Cl. ..................... 438/32; 430/321; 430/323; 430/296; 216/24
(58) Field of Search ................................. 430/321, 323, 430/296; 438/22, 24, 32, 42, 43, 44; 216/24

(56) References Cited

U.S. PATENT DOCUMENTS 5,518,955 A  *  5/1996  Goto et al. .................. 438/32
5,614,436 A  *  3/1997  Shim et al. .................. 438/32
5,668,047 A  *  9/1997  Muroya ....................... 438/31
6,228,671 B1 *  5/2001  Inomoto ...................... 438/32

* cited by examiner

Primary Examiner—Savitri Mulpuri
(74) Attorney, Agent, or Firm—Sughrue Mion, PLLC

(57) ABSTRACT

In exposing a diffraction grating pattern on a resist, the diffraction grating pattern is exposed via EB on an active region and the adjacent thereto only and the region which is not exposed via EB is exposed via Deep UV light so that the resist may be left on the active region and the adjacent thereto only after the exposed resist is developed according to the process of forming a diffraction grating for a distributed feedback semiconductor laser of the present invention. In addition, the resist-coated area can be gradually reduced from the resist existing area to the non-resist existing area and the average height of the substrate on which said diffraction grating is formed can be gradually changed on the diffraction grating forming region and non-diffraction grating forming region which results in preventing the crystallinity of a semiconductor layer on the substrate from being deteriorated. This enables formation of an excellent crystallinity semiconductor layer on the substrate on which the diffraction grating is locally formed.

41 Claims, 18 Drawing Sheets

DISTANCE X(μm) FROM THE CENTER POSITION OF
THE DIFFRACTION GRATING FORMING REGION

DISTANCE X(μm) FROM THE CENTER POSITION OF THE DIFFRACTION GRATING FORMING REGION

METHOD FOR MANUFACTURING DIFFRACTION GRATING AND METHOD FOR MANUFACTURING SEMICONDUCTOR LASER

DETAILED DESCRIPTION OF THE INVENTION

Field of the Invention

The present invention relates to a method for manufacturing a diffraction grating and a method for manufacturing a distributed feedback type semiconductor laser.

BACKGROUND OF THE INVENTION

Adopted as a method for manufacturing a diffraction grating on a semiconductor substrate is forming a pattern directly on a resist via a direct patterning by means of the interference exposure or exposure via electric charge particles such as electrons and ions or forming a pattern on a resist by transferring the pattern formed on a mask. Among other things, the direct patterning method via the electron beam exposure enables forming of the precise, flexible and minute cycle-controlled diffraction grating which results in being excellent in manufacturing a distributed feedback semiconductor laser compared to a method for exposure via the interference exposure or a mask, but said method is inferior to the conventional method in terms of the throughput. To eliminate the disadvantage as described above, adopted is a method wherein when forming a diffraction grating by forming exposed patterns on a semiconductor substrate via an electron beam exposure, said diffraction grating is not formed on an entire surface of said substrate but the electron beam patterning line 1 is locally formed thereon by scanning and exposing electron beams to a region 20 to be the active region and the adjacent thereto only as shown in FIG. 1. This improves the throughput by locally forming the diffraction grating on the desired position of the substrate 4. The exposed patterns in this process are shown in FIG. 2.

However, if a diffraction grating is formed by the method shown in FIG. 1 and FIG. 2, the average height of a n-InP-substrate 4 in a diffraction grating forming region 5 is different from that of the non-diffraction grating 5a. This causes a stair difference on an epitaxial growth layer at the interface portion 5b between the diffraction grating forming region 5 and the non-diffraction grating forming region 5a if semiconductor layers, e.g. a n-InGaAsP guide layer 8, a n-InP spacer layer 9, a n-InGaAsP SCH layer 10, a strained multiquantum well (hereinafter referred to as "strained MQW") active layer 11, an InGaAsP SCH layer 12 and p-InP clad layer 13 are formed in their order on the n-InP-substrate 4 locally forming the diffraction grating in the (100) plane orientation. This stair difference portion causes the crystal growth plane direction to be a high dimensional plane displaced from the (100) plane. The crystal growth rate is thus accelerated and the material gas consumption is increased at the interface portion 5b between he diffraction grating forming region 5 and the non-diffraction grating forming region 5a. This provides an advantage to have the material gas density diluted at the adjacent interface portion and causes the crystal growth rate to be decreased. This also causes the composition of the diffraction grating to be fluctuated and the crystallinity of the growth layer is deteriorated due to the distorted stress resulted from the unaligned diffraction grating, the photo-luminescence half-width thus being increased as shown in FIG. 4. This crystallinity deterioration is resulted from that it is greatly deteriorated at the interface portion 5b and worsened at the center portion of the diffraction grating forming region 5 compared to that of the planar portion.

A great material gas density fluctuation at the interface portion 5b has an effect on the center portion of the diffraction grating 5 which results in having the crystal quality deteriorated compared to that of the planar growth portion. Thus, this deteriorates the quality of the active layer portion of a semiconductor laser which leads to not only the worsening of semiconductor optical output characteristics but also the increase of the threshold current as well as the efficiency deterioration. Furthermore, the crystallinity deterioration at the interface portion has an effect on the block structure in the case of DC-PBH-LD which results in increasing the threshold current and lowering the efficiency.

Also, the material gas density fluctuation not only increases the photo-luminescence half-width due to the crystallinity deterioration of the growth layer but also fluctuates the growth layer composition as well as the photo-luminescence wavelength. This raises a problem where it is difficult to control the band gap energy of the growth layer in addition to the strained MQW layer.

If the diffraction grating forming region 5 is adequately spaced to avoid the problem as described above, the throughput during the electron beam exposure is lowered and the manufacturing cost is greatly increased.

SUMMARY OF THE INVENTION

It is an object of the present invention to provide a method for manufacturing a diffraction grating and a method for manufacturing a distributed feedback type semiconductor laser, in which a high quality crystal growth layer can be formed on a diffraction grating which is locally formed by an electron beam exposure method.

Another object of the present invention is to form a strained MQW active layer wherein the band gap wavelength is not fluctuated on a planar portion and to manufacture a distributed feedback semiconductor laser with the excellent low threshold current characteristics.

A method for manufacturing a diffraction grating according to the present invention is to locally form the diffraction grating on a predetermined position of a semiconductor substrate including a process to coat a resist on an entire surface of the semiconductor substrate; a process to make electron-beam lithography of a diffraction grating pattern comprising straight line patterns to be reciprocally disposed in parallel with the predetermined position of the resist and make a local electron-beam exposure of said resist; a process to develop said resist; and a process to etch the semiconductor substrate using the developed resist as an etching mask wherein the resist used for the semiconductor substrate etching is all removed therefrom except from the diffraction grating forming region.

It is preferable that the resist left on the diffraction grating forming region only by the developing process be formed so that the resist-coated area may be reduced as said resist is away from the diffraction grating forming region. More particularly, a contour of the resist side end portion left on the diffraction grating forming region only may preferably be in the form of concave and convex, zigzag or sine function. Accordingly, if an etching mask pattern so designed as to have the resist-coated area gradually and uniformly changed is used, the average height of the semiconductor substrate resulted from forming a diffraction grating via a wet etching method is not discontinuously changed but gradually changed in the diffraction grating forming region and non-diffraction grating forming region. This is because the wet etchant consumption change is not steep at the interface therebetween. As described above, the gradual change of the average height of the semiconductor substrate enables the semiconductor layer in addition to the strained MQW layer formed thereon to become the same high quality crystal layer as that formed on a planar semiconductor substrate.

To form the diffraction grating as described above, a diffraction grating pattern is exposed by an electron beam exposure method on the adjacent region to be an active layer only during the process of forming a diffraction grating. Thereafter, the region which is not exposed by the electron beam is preferably exposed by a method using deep ultraviolet light in the wavelength range of 200–300 nm (hereinafter "Deep UV" or "deep ultraviolet") and developed so that the resist may be left on the adjacent active region only and the resist-coated area can be gradually reduced from the resist-coated region to the non-resist coated region. Shown in FIG. 2 is the exposure pattern generated during the process of forming a diffraction grating of the present invention, for example, an exposure pattern is so structured that a diffraction grating pattern is formed on a region to be the active region and the adjacent thereto by a WAVE (Weighted-dose Allocation for Variable-pitch EB-corrugation) method and the region other than the diffraction grating forming region is then overlapped with the electron beam exposure pattern and exposed by the Deep UV light, the resist being removed from the region other than the active layer region and the adjacent thereto. Specifically, described below is a method for manufacturing a diffraction grating to achieve the objective as described above.

The method comprises a process to coat on an entire surface of a semiconductor substrate a positive resist to be exposed to both electron-beam and Deep UV light; a process to make electron-beam lithography of a diffraction grating pattern comprising straight line patterns to be reciprocally in parallel with the predetermined position of said resist and make a local electron-beam exposure of said resist; a process to expose with Deep UV light the region other than the electron-beam exposing region so that the interface between the Deep UV exposing region and non-Deep UV exposing region may be in the form of convex and concave; a process to develop said resist so that said resist may be left on a diffraction grating forming region only and removed from any region other than the diffraction grating forming region; and a process to etch said semiconductor substrate using said developed resist as an etching mask wherein the interface between the Deep UV exposing region and non-Deep UV exposing region may be in the form of a zigzag or sine function.

In addition to the foregoing method, described below is a method for manufacturing a diffraction grating comprising a process to coat on an entire surface of a semiconductor substrate a positive resist to be exposed to both electron-beam and Deep UV light; a process to make a local electron-beam exposure of said resist to form on said resist a pattern by reciprocally disposing in parallel on the predetermined position of said resist a number of the predetermined length of the first straight patterning lines and the second straight patterning lines each of which is shorter than each of said first straight patterning lines and which are patterned between said first straight patterning lines and at both ends thereof at several cycle intervals per said first patterning lines; a process to expose with Deep UV light the region other than the electron-beam exposing region so that the interface between the Deep UV exposing region and non-Deep UV exposing region may be in the form of a straight line; a process to develop said resist so that said resist may be left on a diffraction grating forming region only and removed from any region other than the diffraction grating forming region; and a process to etch said semiconductor substrate using said developed resist as an etching mask wherein a diffraction grating is locally formed on the predetermined position of said semiconductor substrate.

Unlike the method for manufacturing a diffraction grating as described above, the following is a method for manufacturing same using a negative resist comprising a process to coat on an entire surface of a semiconductor substrate a negative resist to be exposed to the electron-beam; a process to make a local electron-beam exposure of said resist to form on said resist a pattern by reciprocally disposing in parallel on the predetermined position of said resist the predetermined length of the first straight patterning lines and the second straight patterning lines each of which is shorter than each of the first straight patterning lines after the center of both first straight patterning lines and second straight patterning lines is aligned; a process to develop said resist so that said resist may be left on a diffraction grating forming region only and removed from any region other than the diffraction grating forming region; and a process to etch said semiconductor substrate using said developed resist as an etching mask and to locally form a diffraction grating on the predetermined position of said semiconductor substrate.

In addition to the foregoing, described below is a method for manufacturing a diffraction grating using a negative resist comprising a process to coat on an entire surface of a semiconductor substrate a negative resist to be exposed to the electron-beam; a process to make a local electron-beam exposure of said resist to form on said resist a pattern by reciprocally disposing in parallel on the predetermined position of said resist a number of the predetermined length of the first straight patterning lines and by disposing one or a plurality of the second straight patterning lines at several cycle intervals per said first straight patterning lines after aligning the center of both first straight patterning lines and second straight patterning lines each of which is shorter than each of the first straight patterning lines; a process to develop said resist so that said resist may be left only on a diffraction grating forming region and removed from any region other than the diffraction grating forming region; and a process to etch said semiconductor substrate using said developed resist as an etching mask and to locally form a diffraction grating on the predetermined position of said semiconductor substrate.

In this process, a chemically-amplified negative resist with the excellent sensitivity and resolution is suitable for forming a fine pattern.

The following is the description with respect to an additional method for manufacturing a diffraction grating using a positive resist comprising a process to coat on an entire surface of a semiconductor substrate a positive resist to be exposed to both electron-beam and Deep UV light; a process to make a local electron-beam exposure of said resist to form on the predetermined position of said resist a pattern comprising a number of the predetermined length of the straight patterning lines which are reciprocally disposed in parallel and the adjacent both ends of which are double-exposed; a process to expose with Deep UV light the region other than the electron-beam exposing region so that the interface between the Deep UV exposing region and non-Deep UV exposing region may be in the form of a straight line; a process to develop said resist so that said resist may be left on a diffraction grating forming region only and removed from any region other than the diffraction grating forming region; and a process to etch said semiconductor substrate using said developed resist as an etching mask and to locally form a diffraction grating on the predetermined position of said semiconductor substrate.

In addition to the foregoing method, described below is a method for manufacturing a diffraction grating using a positive resist comprising a process to coat on an entire surface of a semiconductor substrate a positive resist to be exposed to both electron-beam and Deep UV light; a process to make a local electron-beam exposure of said resist to form on the predetermined position of said resist a pattern comprising a number of the predetermined length of the straight patterning lines which are reciprocally disposed in parallel wherein the adjacent both ends of one or a plurality of said straight patterning lines are double-exposed every other lines; a process to expose with Deep UV light the region other than the electron-beam exposing region so that the interface between the Deep UV exposing region and non-Deep UV exposing region may be straight line; a process to develop said resist so that said resist may be left on a diffraction grating forming region only and removed from any region other than the diffraction grating forming region; and a process to etch said semiconductor substrate using said developed resist as an etching mask wherein a diffraction grating is locally formed on the predetermined position of said semiconductor substrate.

Furthermore, the following is another method for manufacturing a diffraction grating using a positive resist comprising a process to coat on an entire surface of a semiconductor substrate a positive resist to be exposed to both electron-beam and Deep UV light; a process to make a local electron-beam exposure of said resist to form on the predetermined position of said resist a pattern comprising a number of the predetermined length of the straight patterning lines which are reciprocally disposed in parallel wherein the adjacent both ends of one or a plurality of said straight patterning lines are double-exposed at several cycle intervals per said straight patterning lines; a process to expose with Deep UV light the region other than the electron-beam exposing region so that the interface between the Deep UV exposing region and non-Deep UV exposing region may be straight line; a process to develop said resist so that said resist may be left on a diffraction grating forming region only and removed from any region other than the diffraction grating forming region; and a process to etch said semiconductor substrate using said developed resist as an etching mask wherein a diffraction grating is locally formed on the predetermined position of said semiconductor substrate.

A method for manufacturing a semiconductor laser of the present invention comprises locally forming a diffraction grating on the predetermined region of a semiconductor substrate and laminating and growing a semiconductor multilayer structure including an active layer on said semiconductor substrate wherein each of said methods of manufacturing a diffraction grating is adopted in the process of manufacturing said diffraction grating.

The description above is directed to the method for manufacturing a semiconductor laser of the present invention. According to a method for manufacturing a semiconductor laser of the present invention, it is possible to provide the same optical output characteristics and reliability as those of a DFB-LD with a semiconductor layer on a semiconductor substrate on the entire surface of which a diffraction grating is formed. Furthermore, each form of the diffraction grating formed by the interference exposure is randomly fluctuated and thus, there causes waveguide light loss in the DFB-LD with a diffraction grating formed by the interference exposure. However, an electron beam exposure method according to the present invention eliminates said problem and provides a high yield and low cost DFB-LD.

During the process of forming a diffraction grating for a DFB-LD of the present invention, a stripe resist is locally formed on a diffraction grating forming region of a substrate so that an area covered by the resist may gradually be reduced from the resist existing region to the non-existing region and thus, the area covered by the resist may gradually and uniformly be changed. Accordingly, the average height of the semiconductor substrate resulted from forming a diffraction grating via a wet etching method is not discontinuously changed but gradually changed in a diffraction grating forming region and non-diffraction grating. This results in providing a semiconductor layer formed on the diffraction grating which has same high quality as that of a semiconductor layer formed on a planar substrate. It is, therefore, possible to provide the excellent optical output characteristics and high reliability DFB-LD. In addition, there causes waveguide light loss in the DFB-LD according to a method for forming a diffraction grating via the interference exposure since the form of the diffraction grating is randomly fluctuated. However, an electron beam exposure method according to the present invention eliminates said problem and provides a high yield and low cost DFB-LD.

DETAILED DESCRIPTION OF THE PREFERRED EMBODIMENTS

The detailed description of the preferred embodiment of the present invention is provided below in reference to the accompanying drawings.

First embodiment

Figure 5A:
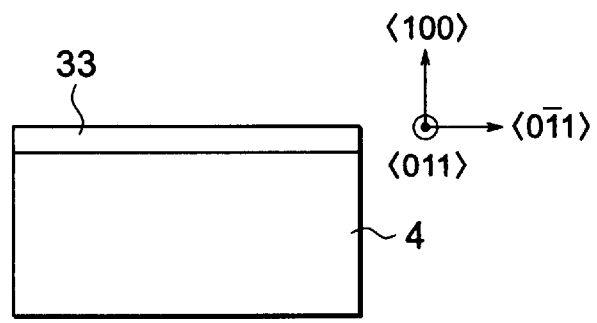
FIG. 5A to FIG. 5E are sectional illustrations showing in the order of a process a method for forming a diffraction grating in a first embodiment of the present invention.
Figure 5B:
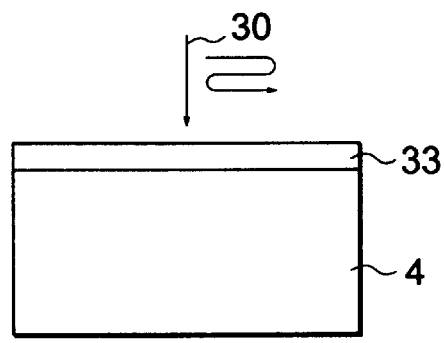
Figure 5C:
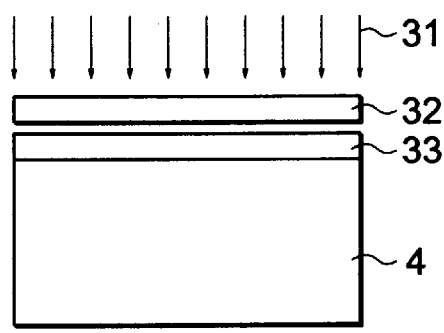
Figure 6:
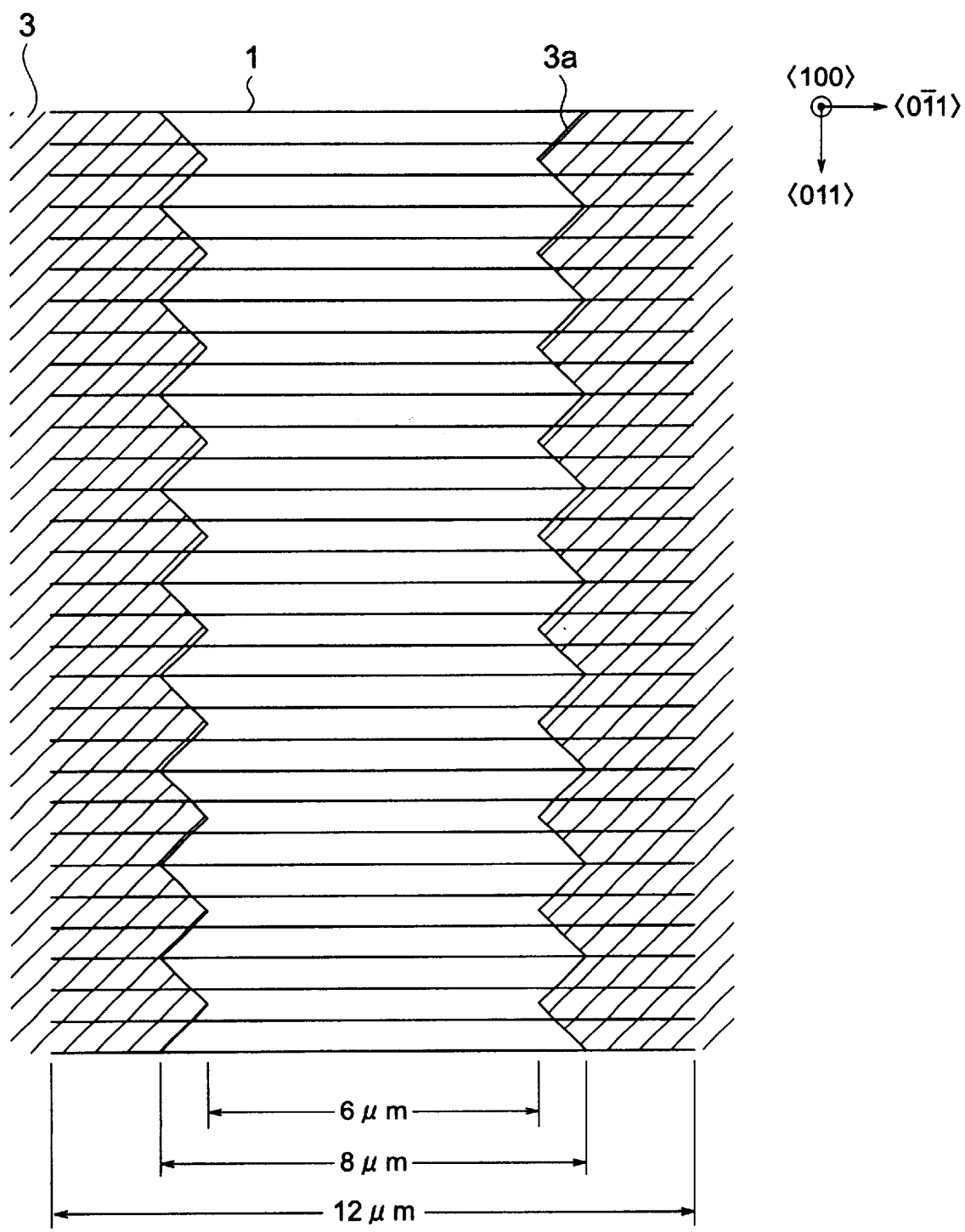
FIG. 6 shows an exposure pattern in a method for forming a diffraction grating in a first embodiment of the present invention.
Figure 7:
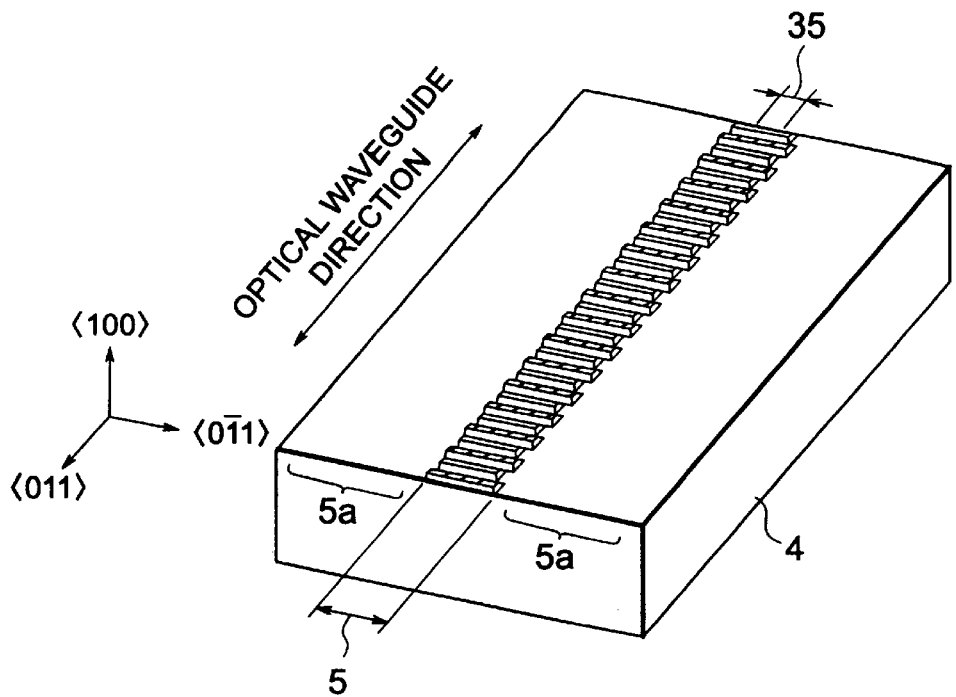
FIG. 7 is an oblique illustration showing a diffraction grating formed during the process of forming a diffraction grating in a first embodiment of the present invention.

FIGS. 5A–5E shows a process of forming a diffraction grating of a distributed feedback semiconductor laser in a first embodiment of the present invention. Also, FIG. 6 is a plan showing an exposure pattern formed during the process of forming the diffraction grating of the distributed feedback semiconductor laser in the first embodiment of the present invention. Since a distributed feedback laser is generally called DFB-LD (Distributed Feedback Laser Diode), this abbreviation is used hereinafter below. FIG. 7 is an oblique illustration showing an InP-substrate on which a diffraction grating is formed by a process of forming the diffraction grating in FIGS. 5A–5E, FIG. 8, a sectional illustration showing a multilayer semiconductor layer laminated on the InP-substrate during the subsequent process of growing the organometallic vapor phase epitaxy as shown in FIGS. 5A–5E and FIG. 9, a section vertical to the light axis Of DFB-LD manufactured in the first embodiment of the present invention.

A DFB-LD used in the optical fiber communication generates the light with the wavelength of about 1.31 μm or 1.55 μm and the InGaAsP series on the InP-substrate is generally used as a material to generate the light. According to a method for manufacturing the DFB-LD which is commonly adopted, the first process is to form a diffraction grating on a n-InP-substrate 4 as shown in FIGS. 5A–5E. During the diffraction grating forming process, a photoresist 33 (ZEP520-brand name-made by Japan Zeon Corporation) to be exposed to both electron beam and Deep UV light is first coated by a spinner on the n-InP-substrate 4 whose plane orientation is (100) (FIG. 5A). After exposing the resist 33 with the electron beam 30 (FIG. 5B), the exposed resist is overlapped with an end portion of the electron beam exposing region and the region other than the electron beam exposing region is exposed with the Deep UV light 31 (FIG. 5C and FIG. 6). An electron beam is generally called EB (abbreviation of Electron Beam) and this abbreviation is used hereinafter below. The WAVE (Weighted-dose Allocation for Variable-pitch EB-Corrugation) technology disclosed in the laid-open patent portfolio (Japanese Patent Application Laid Open No. Hei 8-227838) used for the electron beam exposure. According to the WAVE technology, a diffraction grating is patterned by three EB patterning lines each of which has the different dose volume. The average diffraction grating pitch is achievable with much more precision than the electron beam minimum moving distance by changing the allocation ratio and keeping the total dose volume of three EB patterning lines. FIG. 6 shows that these three EB patterning lines are represented by one line and designated as one electron beam patterning line 1. When forming a diffraction grating by an interference exposure method, it is formed on an entire surface of the InP-substrate but on an active region 35 only by the EB method considering the throughput improvement. However, the length (the patterning width or scanning one) of the electron beam 1 is to be 12 μm which is wider than that of the active region, considering the matching displacement with the subsequent process. The diffraction grating pitch is 202.5 nm at the 1.31 μm band and 243 nm at the 1.55 μm. Each direction of the electron beam patterning lines is in the direction of <0–11>.

After the EB patterning is conducted, the UV exposing region 3 is exposed with the UV light 31 (FIG. 5C) without developing the EB exposed region. A quartz mask 32 for the UV exposure is the one whose shielding portion is in the range of 6 μm to 8 μm in width and whose contour portion is in the form of a corrugation.

Figure 5D:
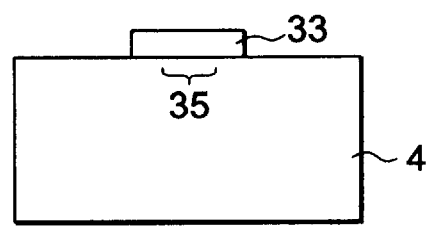

After said EB exposure and Deep UV exposure, the exposed region of the substrate is developed (FIG. 5D). The region on which the resist 33 is left after said development is the one being in the range of 6 μm to 8 μm in width crossing the region 35 to be an active layer. Using said resist 33 as an etching mask, an InP-substrate 4 is wet-etched by a bromine series etchant (hydrobromic acid: 3% hydrogen peroxide water pure water=10:1:100). In said process, the etching shape of each diffraction grating is in the form of a forward mesa. Also, the wet etching depth is controlled to be in the range of 50 nm to 60 nm at the center of the diffraction grating region 5. If said etching depth is targeted, the etching depth at a planar region without diffraction gratings becomes shallow. This is because at the diffraction grating region 5, the etchant consumption volume is less than at the region without resists and the etchant density thus becomes relatively high. The echant consumption volume at the interface between the diffraction grating region 5 and planar region 5a without diffraction gratings is gradually fluctuated since the resist remaining shape is in the form of a corrugation. This causes no rapid change at the interface portion with respect to the etching depth. Also, if the interface portion is in the form of a straight line, said portion is changed to be a reverse mesa section and thus, the etching shape becomes steep from the crystal direction viewpoint. However, the etching angle at the interface portion can be loosened by having the etching shape corrugated and making oblique the interface portion 3a.

Figure 5E:
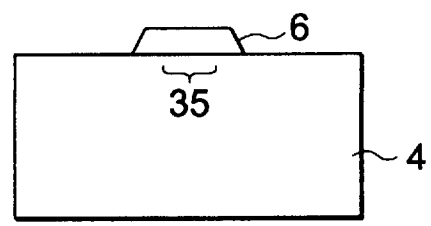

After the etching as described, a diffraction grating 6 is formed on the InP-substrate when removing the resist 33 therefrom (FIG. 5E and FIG. 7). FIG. 7 is an oblique illustration showing the n-InP substrate 4 on which the diffraction grating 6 is formed. A diffraction grating forming region 5 is formed across an active region 35 which is to be formed in the subsequent process and which is in the shape of not having an etching stair difference at the interface portion. During the strained MQW crystal growth via the subsequent process of the metal organic vapor phase epitaxy (hereinafter referred to as MO-VPE), said structure enables the crystal surface to be planar and thus, achieves the indefective and high quality crystallinity.

Figure 1:
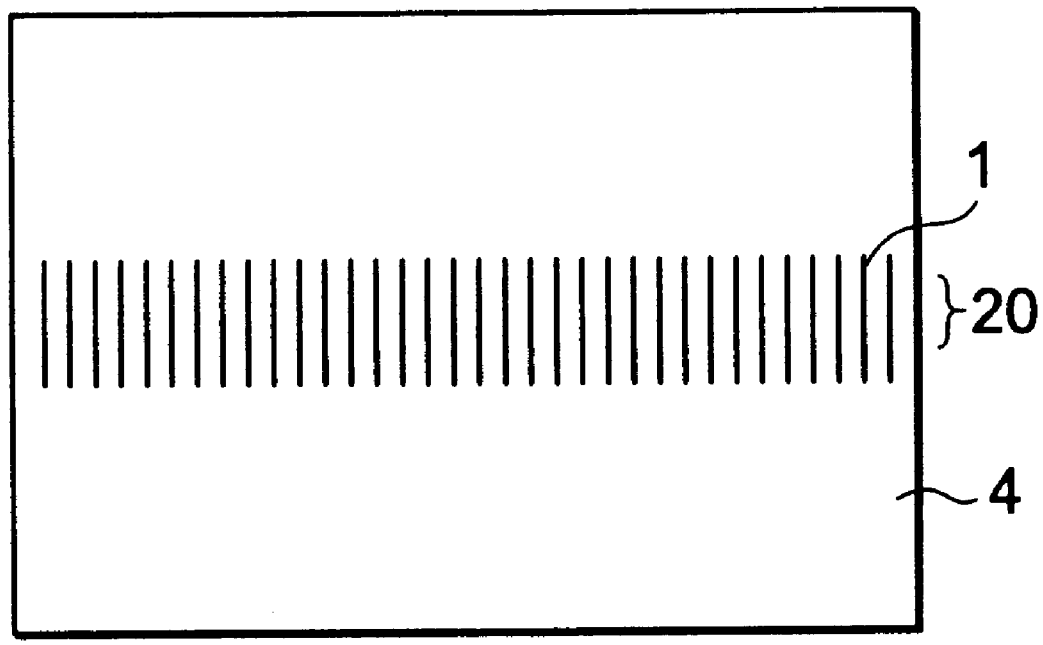
FIG. 1 shows an exposure pattern formed during the process of forming a diffraction grating in a method for manufacturing a conventional distributed feedback semiconductor laser.
Figure 2:
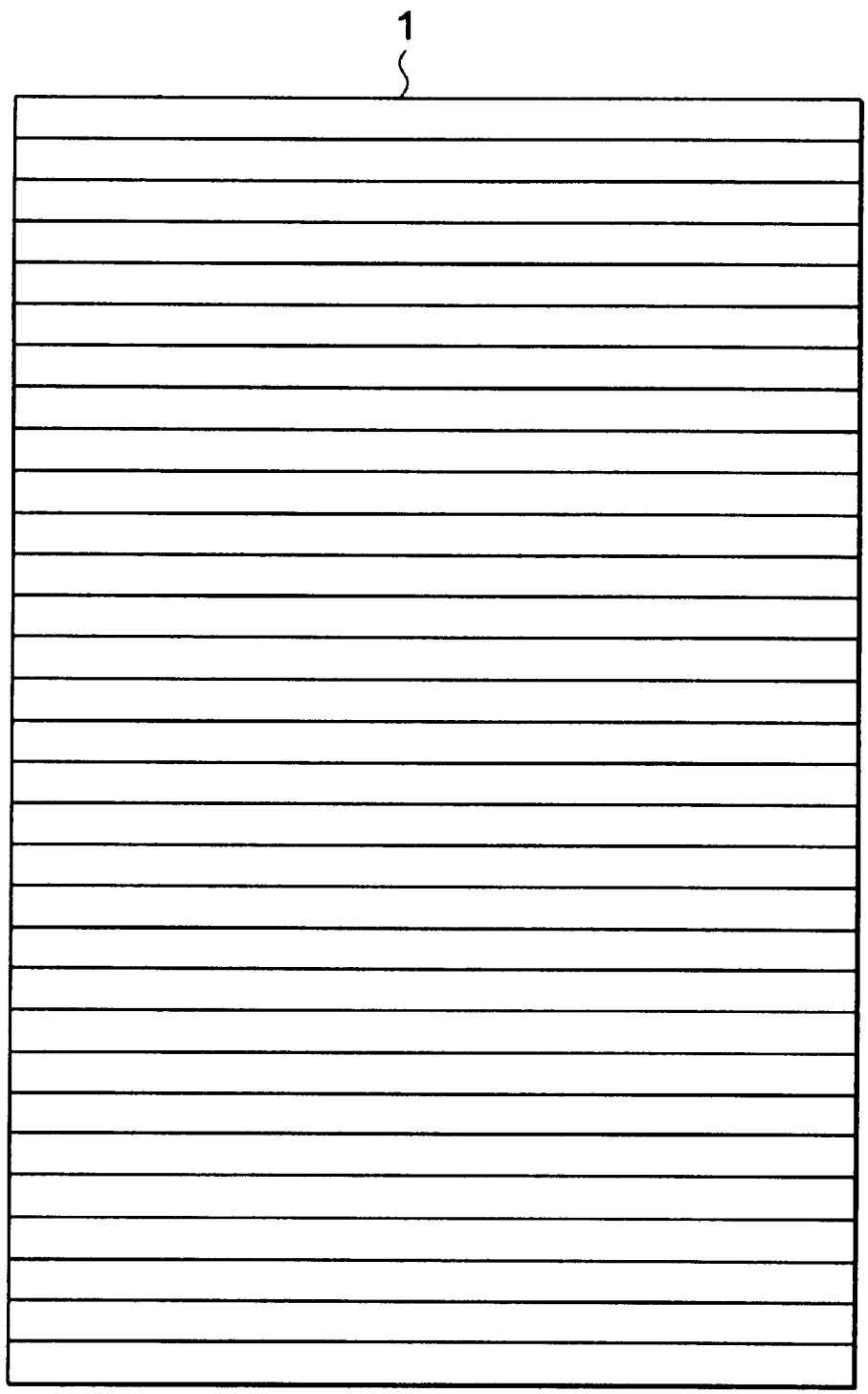
FIG. 2 shows a magnified exposure pattern formed during the process of forming the diffraction grating in the method for manufacturing the conventional distributed feedback semiconductor laser.
Figure 3:
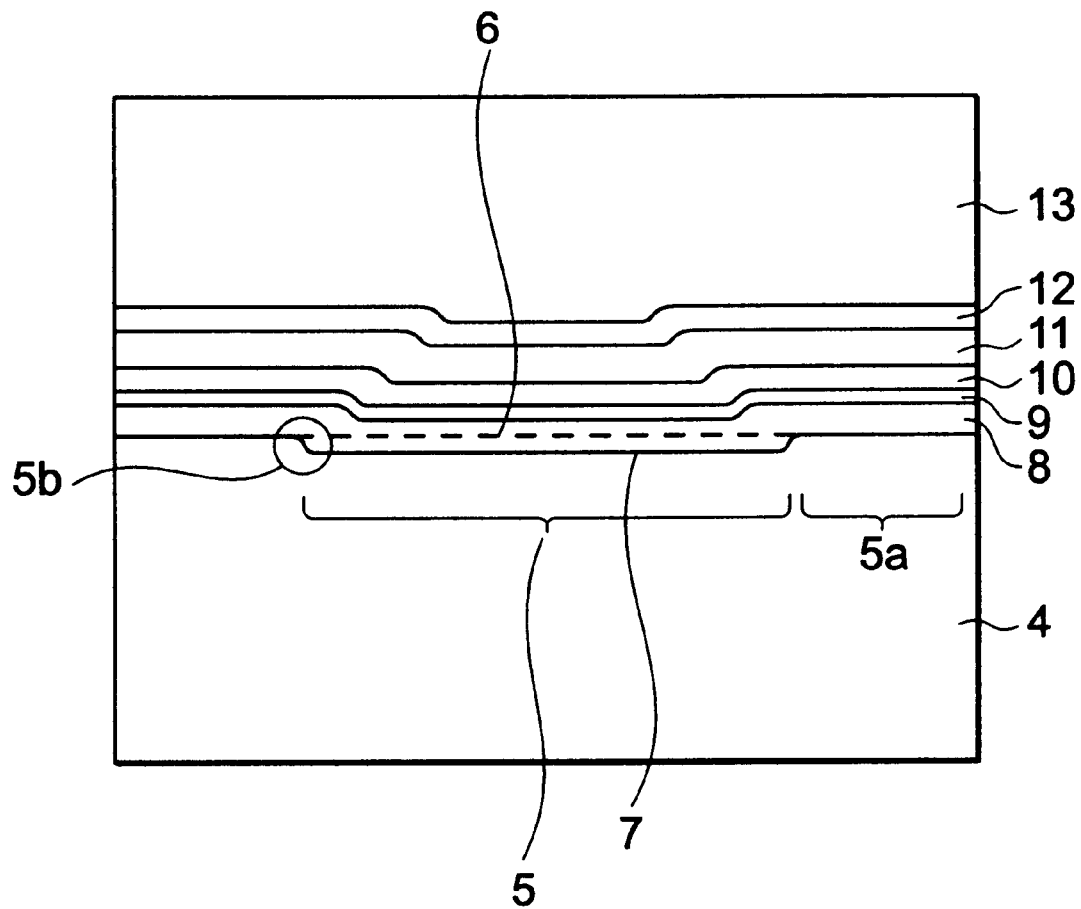
FIG. 3 shows a section of a semiconductor layer which is multilayer-laminated by the method for manufacturing the conventional distributed feedback semiconductor laser.
Figure 8:
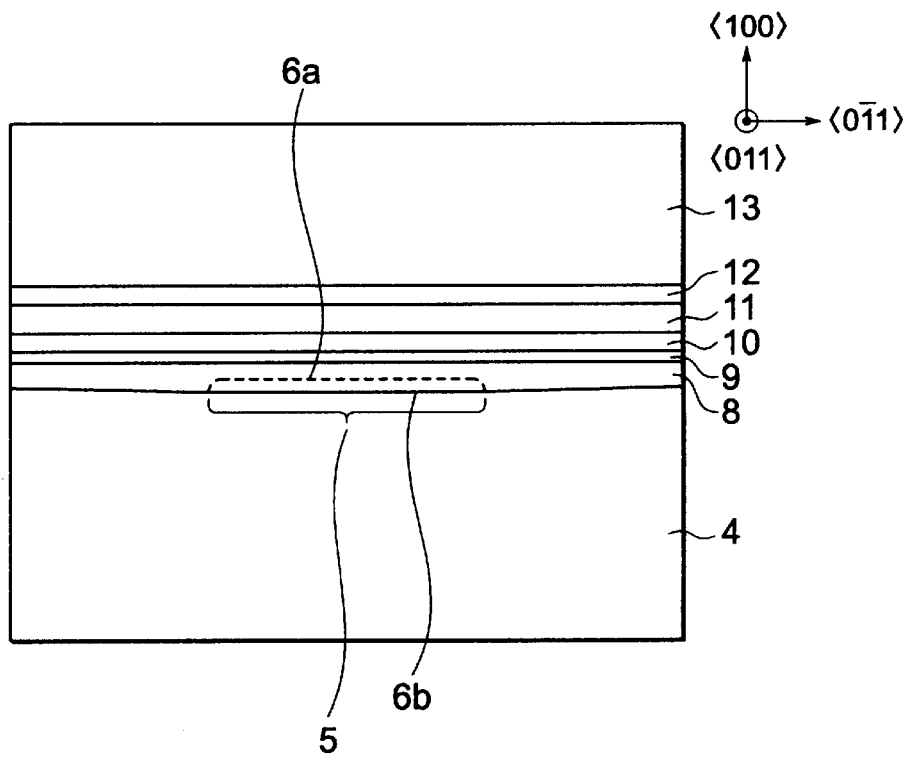
FIG. 8 is a sectional illustration showing a semiconductor layer formed on a substrate during the process of a MO-VPE in a first embodiment of the present invention.
Figure 9:
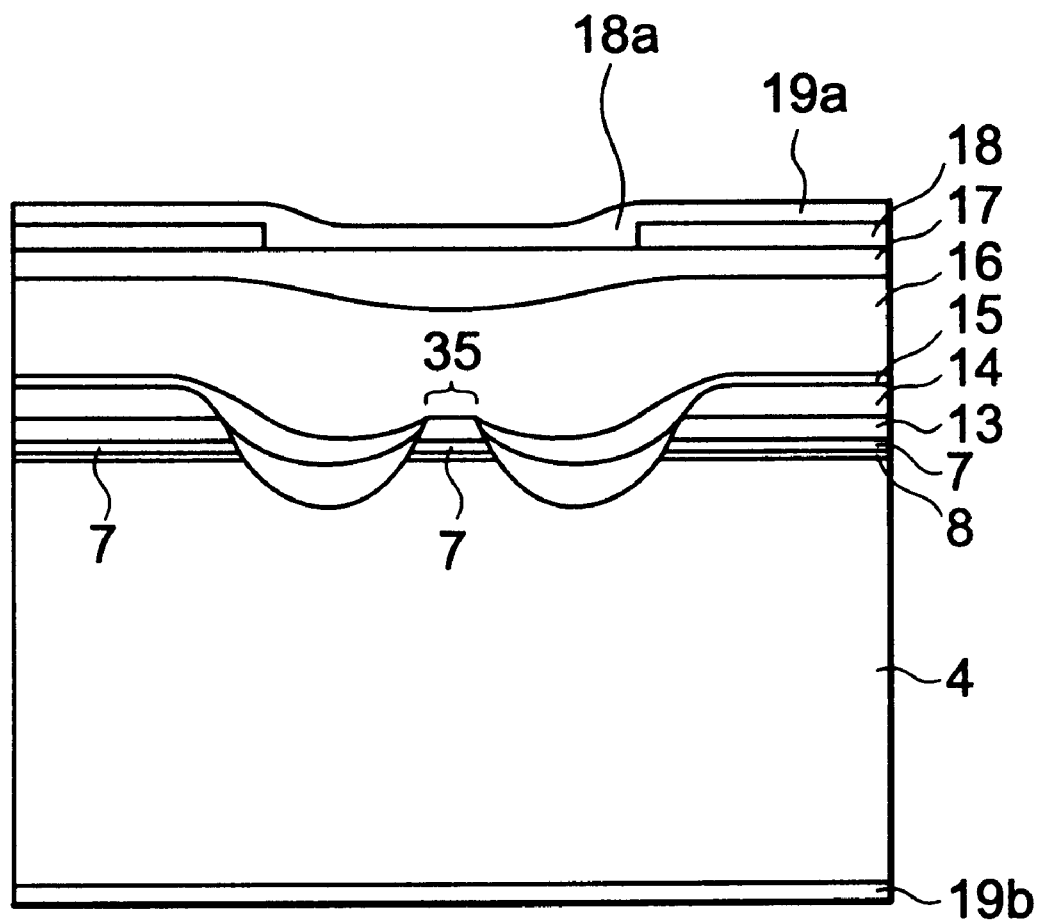
FIG. 9 is a sectional illustration showing a DFB-LD manufactured by a manufacturing method in a first embodiment of the present invention.

After forming the diffraction grating 6 on the n-InP substrate 4, a semiconductor layer including an active layer is laminated and grown on the n-InP substrate via the MO-VPE process as shown in FIG. 8. FIG. 8 is a sectional illustration showing the MO-VPE crystal epitaxy layer vertical to a direction (the direction of (<011> (See FIG. 3)) to be the optical waveguide direction. During said MO-VPE process, the n-InP substrate 4 on which a diffraction grating is formed is heated in the atmosphere of phosphine ($PH_3$) and arsine ($AsH_3$). In said process, the shape of the diffraction grating 6 is loosened and the height difference between the top 6a and bottom 6b of the diffraction grating in the diffraction grating forming region 5 is reduced to be 30 nm by a mass transport method. After said heating is complete, the crystal epitaxy is carried out at 650° C. and 76 Torr. During the crystal epitaxy, an n-InGaAsP guide layer 8 with the band gap wavelength of 1.05 $\mu$m (hereinafter referred to as 1.05 $\mu$m composition) is first grown to be 90 nm in the average thickness. Since there causes no specific great stair difference at the interface of the diffraction grating forming region 5, the growing surface of the n-InGaAsP guide layer 8 becomes planar during the growth of said layer and thus, a planar epitaxy layer can be formed on the subsequent. n-InP spacer layer. on a surface of the n-InP spacer layer 9 which has been grown to be 30 nm, laminated in their order are a n-InGaAsP SCH layer 10 (SCH stands for Separate confinement Heterostructure.) with 1.13 $\mu$m composition and 40 nm in thickness; a five-well-layer strained MQW active layer 11; an InGaAsP SCH layer 12 with 1.13 $\mu$m composition and 60 nm in thickness and p-InP clad layer. In the process as described above, the strained MQW active layer 11 is in the form of a strained MQW layer formed by reciprocally laminating a InGaAsP barrier layer with 1.2 $\mu$m composition and 10 nm in thickness and InGaAsP well layer with the compressed distortion ratio of 1.25%, 1.47 $\mu$m composition and 5 nm in thickness, and the oscillating wavelength thereof is 1.55 $\mu$m. If the interface between the n-InGaAsP guide layer 8 and n-InP spacer layer 9 is not flat, there causes crystal defects from the strained MQW active layer 11 because the distortion stress from the n-InGaAsP guide layer 8 is transferred to the strained MQW active layer 11. However, in the case of an embodiment of the present invention, the distortion stress due to the composition fluctuation of the n-InGaAsP guide layer 8 at the interface of the diffraction grating forming region 5 is not transferred beyond the n-InP spacer layer 9 since the flatness of the n-InGaAsP guide layer is. maintained at the early stage of said growth. It is, therefore, possible to provide an excellent crystallinity semiconductor layer even if said semiconductor layer is epitaxially grown on the entire surface of a substrate on which a diffraction grating is locally formed by the direct EB patterning.

After the semiconductor layer lamination via MO-VPE, a resist is coated on a p-InP clad layer 13 and then, a stripe aperture extending to the direction of <011> on the position of both sides of the diffraction grating forming region is formed on a resist via the usual photolithography and wet etching. Using two pieces of resist with the stripe aperture as etching masks, a semiconductor layer exposed to the stripe aperture is wet-etched extending from the depth of the p-InP clad layer 13 to that of the n-InP substrate 4 and the stripe active region 35 between two channels is thus formed. Then, the resists are removed and as shown in FIG. 5, grown on both sides of the stripe active region 35 are a p-InP block layer 14 with the carrier density of $8\times10^{17}$ $cm^{-3}$, a stripe active region, a p-InP buried layer 16 with the carrier density of $8\times10^{17}$ $cm^{-3}$ on the upper portion of the n-InP block layer 15 and P-InGaAsP contact layer 17 with the carrier density of $1\times10^{18}$ $cm^{-3}$ and band gap wavelength of 1.22 $\mu$m. After a pnpn block structure is formed, the carrier density of the p-InGaAsP contact layer 17 has been established to be $1\times10^{19}$ $cm^{-3}$ via Zn-diffusion. Thereafter, formed on a p-InGaAsP contact layer 17 is a $SiO_2$ film 18 with the stripe aperture 18a of 10 $\mu$m in width on the position corresponding to the upper portion right on the stripe active region, and electrodes 19a and 19b are formed on the $SiO_2$ film and back of the substrate and cleaved into each chip. A DC-PBH (Double Channel Planar Buried Heterostructure) DFB-LD is complete with the final process as described above. FIG. 5 shows that a n-InP spacer layer 9, a n-InGaAsP SCH layer 10, a strained MQW active layer 11 and InGaAsP SCH Layer 12 are represented by an active waveguide 7.

A crystal with no transfer on the entire surface of a semiconductor layer is obtained in the MO-VPE process prior to the LPE and thus, said transfer is not succeeded in the LPE process, not being cleaved into the pnpn block structure.

Therefore, the DC-PBH-DFB-LD manufactured according to the first embodiment of the present invention provides the life time of more than 100,000 hr required for the optical fiber communication.

Figure 4:
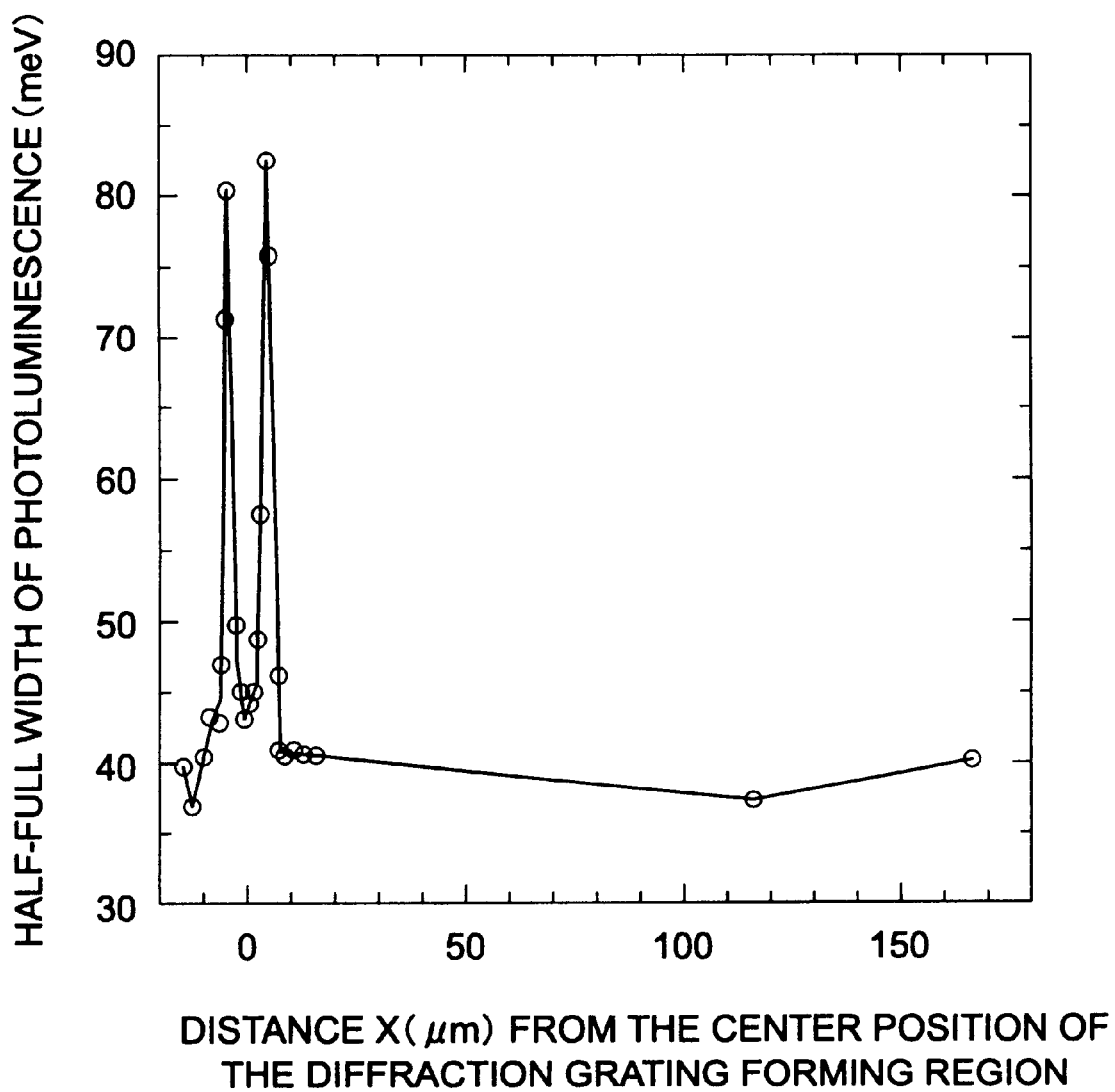
FIG. 4 is a graph showing the evaluation results on the photo-luminescence of a semiconductor layer formed by the method for manufacturing the conventional distributed feedback semiconductor laser.
Figure 10:
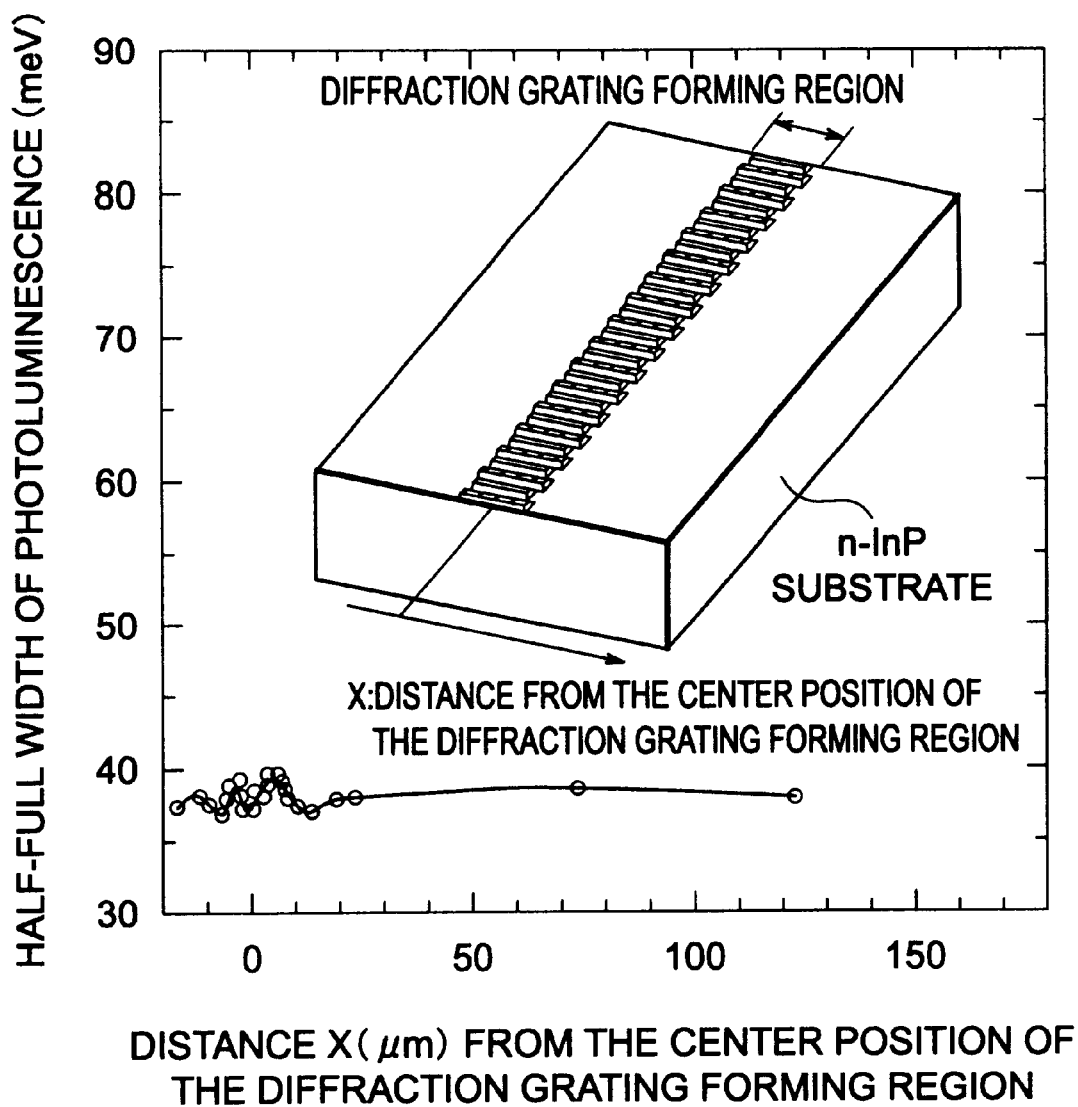
FIG. 10 is a graph showing the evaluation results on a photo-luminescence of a semiconductor layer formed by a method for manufacturing a distributed feedback semiconductor laser of the present invention.

The more detailed description on the reason for the foregoing is provided below referring to FIG. 10 and FIG. 4. FIG. 10 shows the evaluation results on the photo-luminescence of a semiconductor layer grown via MO-VPE on a substrate forming a diffraction grating according to the first embodiment of the present invention. FIG. 4 shows the evaluation results on the photo-luminescence of a semiconductor layer grown via MO-VPE on a substrate forming a diffraction grating in accordance with the conventional method. According to the present invention, the interface between the n-InGaAsP guide layer 8 and n-InP spacer layer 9 at the interface of the diffraction grating forming region is flat and thus, the additional distortion stress is not applied to the strained MQW layer 11. This can provide the strained MQW layer with no crystal defect showing that the half-full width of the photo-luminescence is far narrower than that of the conventional one. According to the conventional method, the crystal-grown surface is not flat and the plane direction of the crystal grown surface is displaced from the (100) plane. This causes not only the composition displacement from the n-InGaAsP guide layer 8 but also the unaligned diffraction grating to the InP as well as the distortion stress. It is evident from the description above that the half-full width is wide and the crystallinity is deteriorated as shown in FIG. 4.

According to the first embodiment of the. present invention, the half-width of the photo-luminescence is less than 40 mev which results in providing the same crystallinity quality as that obtained on the flat region without diffraction gratings as shown in FIG. 10. Furthermore, the diffraction grating formed via EB exposure is far more uniformly structured than that of the diffraction grating formed via the interference exposure. If a DFB-LD is manufactured using a substrate on which a diffraction grating is formed according to the first embodiment of the present invention, there causes no waveguide loss due to the fluctuation of the diffraction grating shape which results in improving the optical output characteristics.

Also, it is possible to not only reduce the composition fluctuation of the epitaxy layer to such extent that the fluctuation of the photo-luminescence can be neglected but also provide high quality crystallinity according to the first embodiment of the present invention. This facilitates controlling of the strained MQW layer.

As shown in FIG. 6, the interface 3a with the Deep UV exposing region 3 is established to be in the form of a zigzag but may be of sine function according to the first embodiment of the present invention. Furthermore, in a Deep UV exposure, it is possible to use such a mask that the transmittance adjacent to the interface with the transmitting portion and light shielding portion is gradually lowered as said interface is a way from the transmitting portion. Also, during the process of forming a diffraction grating, the Deep UV exposure is has been conducted after the EB exposure but the Deep UV exposure may be carried out after the EB exposure.

Second embodiment

Next, provided below is the description with respect to a second embodiment of the present invention. According to the first embodiment of the present invention, in the form of a zigzag is a contour of the side end portion of the stripe resist (Diffraction grating patterns are embedded therein.) left on the diffraction grating forming region via Deep UV exposure using a mask pattern whose shape is in the form of a zigzag at the interface with the transmitting portion and light shielding portion and the resist area becomes gradually increased from the resist side end portion to the center of the stripe. However, the contour of the side end portion of the stripe resist left on the diffraction grating forming region is in the form of a zigzag by changing the EB lithography pattern according to the second embodiment of the present invention.

The EB lithography pattern and Deep UV exposure pattern are shown in FIG. 6. The second embodiment of the present invention is different from the first embodiment in the EB lithography pattern and Deep UV pattern and the other processes (DFB-LD manufacturing processes such as resist coating, EB exposure, Deep UV exposure, development, etching, MO-VPE and LPE, etc. as shown in FIGS. 5A–5E, FIG. 8 and FIG. 9) are the same as those in the first embodiment. Accordingly, described below are the ED lithography pattern and Deep UV exposure pattern which are different from those in the first embodiment. The description with respect to the other processes is thus omitted.

Figure 11:
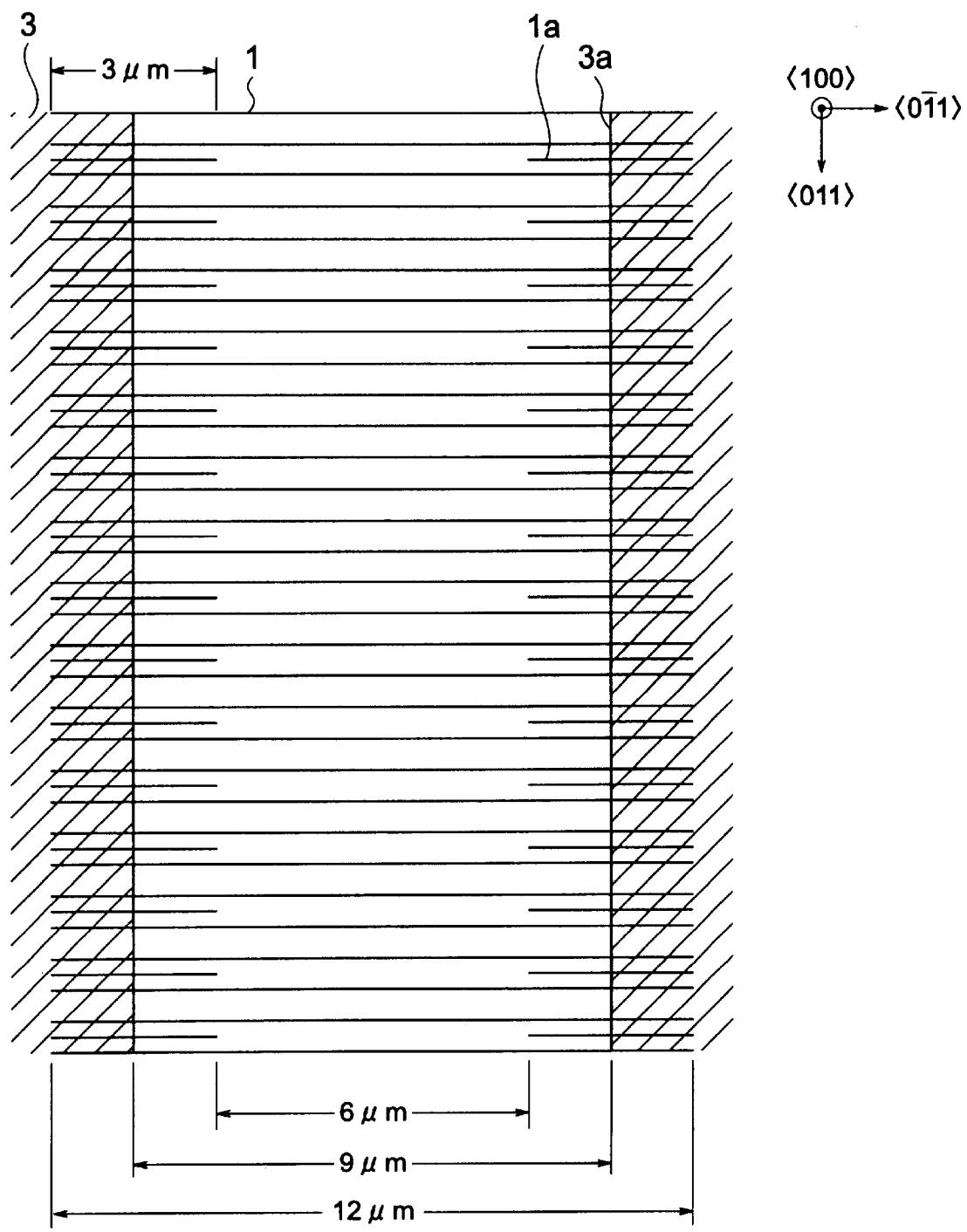
FIG. 11 shows an exposure pattern formed during the process of manufacturing a diffraction grating in a second embodiment of the present invention.

As shown in FIG. 11, an electron beam lithography line is comprised of an electron beam lithography line (1) with the width of 12 μm which is disposed at a predetermined pitch and an electron beam lithography line 1a which is buried in every other pitch at both ends of the electron beam lithography line 1 each end width of which is 3 μm. As shown with oblique lines in FIG. 11, the UV exposing region 3 with which the interface 3a is in the form of a straight line is outside of the region with the width of 9 μm and these patterns are formed using the same resist as that in the first embodiment via the same processes as those in FIGS. 5A–5E, i.e. resist coating, EB exposure and Deep UV exposure (a mask whose interface with the transmitting portion and light shielding portion is in the form of a straight line).

According to the exposures (EB exposure and Deep UV exposure) of the second embodiment of the present invention, the developed resist width is repeated in every other width of 6 μm and 9 μm and the area covered with the resist is step by step changed at the portion with the width of 3 μm on the adjacent side end portion of the diffraction grating forming region. In addition, said change is caused by the EB exposure and the fine resist area change is achievable. It is, therefore, not difficult to make the etching stair difference smaller than that of the first embodiment since the etchant density change at time of wet etching is loosened.

After the resist is developed, formed in their order according to the same manufacturing process as that of the first embodiment are a diffraction grating 6, a n-InGaAsP guide layer 8, a n-InP spacer layer 9, a n-InGaAsP SCH layer 10, a strained MQW active layer 11, an InGaAsP SCH layer 12, a p-InP clad layer 13, two channels between which a stripe active region is disposed, a p-InP block layer 14, a n-InP block layer 15, a p-InP buried layer 16, a p-InGaAsP contact layer 17, a $SiO_2$ film 18 with a stripe aperture 18a and electrodes 9a and 19b. Each of said electrodes is cleaved into each chip. A DC-PBH-DFB-LD with the same semiconductor-laminated structure as that of the first embodiment of the present invention is complete with the manufacturing process as described above.

Third Embodiment

Figure 12:
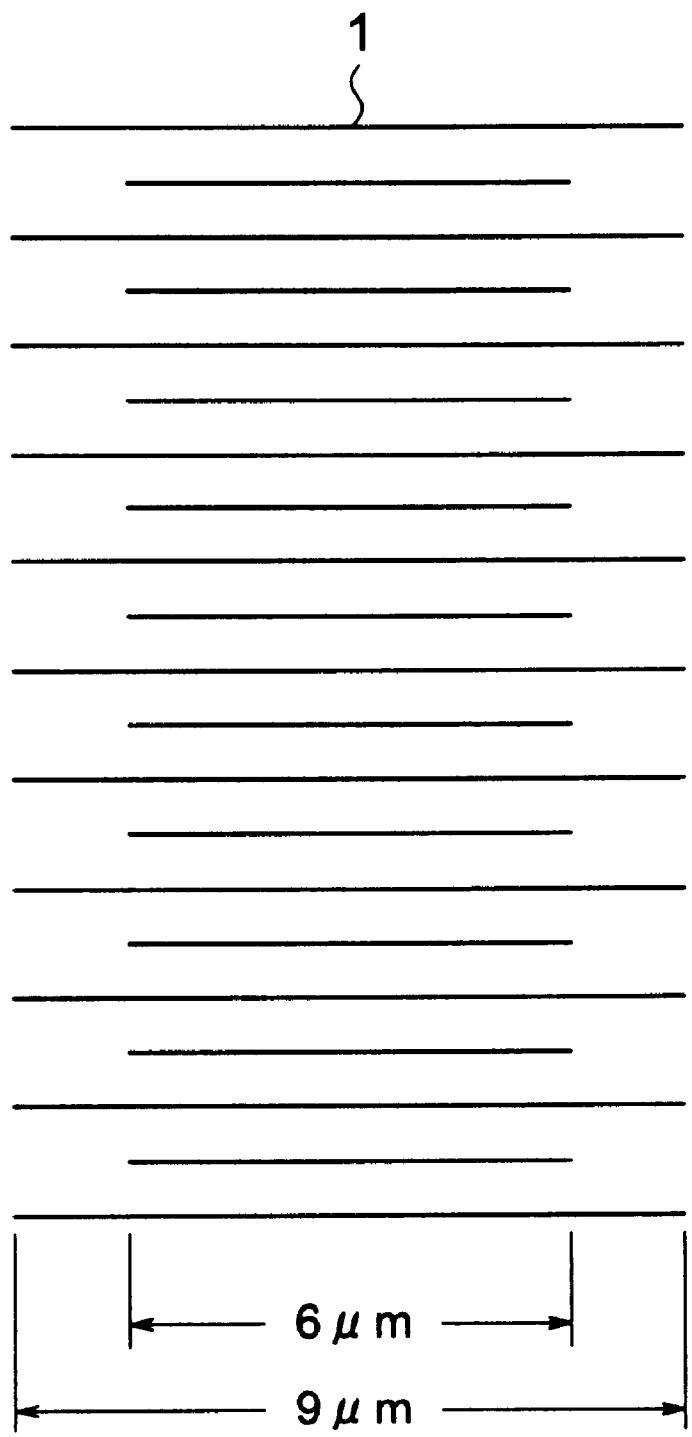
FIG. 12 shows an EB exposure pattern formed during the process of forming a diffraction grating in a third embodiment of the present invention.
Figure 13:
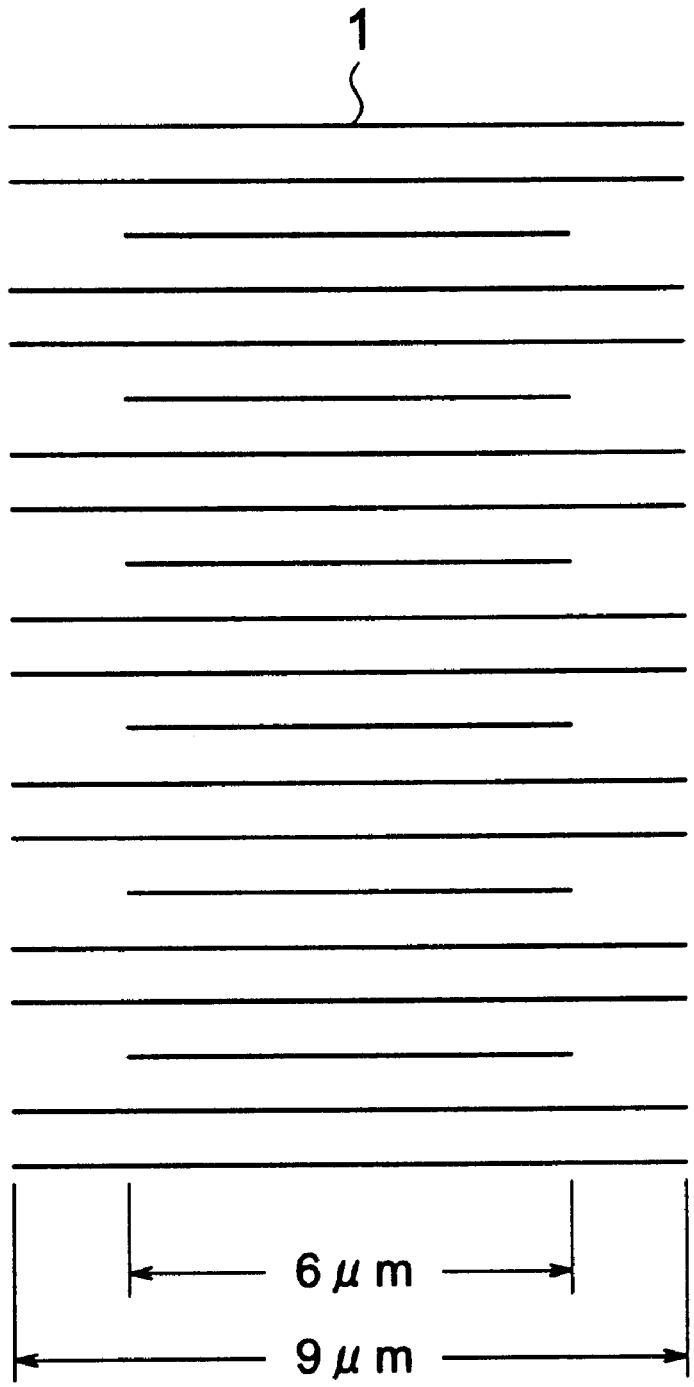
FIG. 13 shows an EB exposure pattern formed during the process of forming a diffraction grating in a third embodiment of the present invention.
Figure 14:
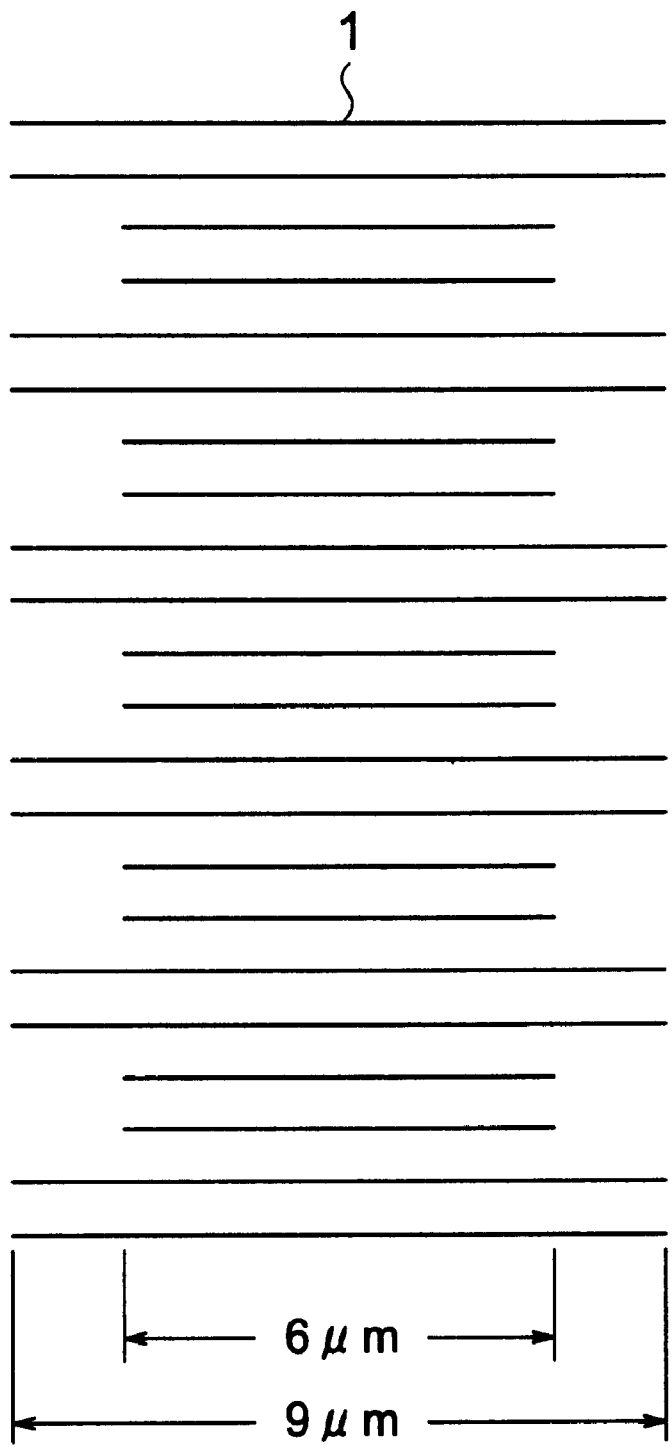
FIG. 14 shows an EB exposure pattern formed during the process of forming a diffraction grating in a third embodiment of the present invention.

According to the first and second embodiments of the present invention, the Deep UV exposure is carried out using a positive resist after the EB exposure but using a negative resist in stead of a positive one, said resist shape is achieved via the EB lithography only without Deep UV exposure. That is, a diffraction grating is formed via resist coating (FIG. 5A), EB exposure (FIG. 5B), development (FIG. 5D) and etching (FIG. 5E). The EB exposure pattern in the case of said process should be a pattern obtained by reciprocally repeating the electron beam lithography line 1 with the width of 6 μm and the one with width of 9 μm at predetermined pitch so that the width of each resist left after the development thereof may be 6 μm and 9 μm respectively as shown in FIG. 12. Furthermore, it is not directed to change every other one out of scanning widths but to form an electron beam lithography line 1 so that the scanning width may be changed per several cycles as shown in FIG. 13 and FIG. 14.

The manufacturing process of the DFB-LD after a diffraction grating is formed on a substrate is the same as that of the first embodiment and thus, the description thereof is omitted herein. Also, a substrate material, a semiconductor composition and DFB-LD structure are the same as those of the first embodiment.

A chemically-amplified negative resist may be used as a negative resist. A negative resist, NEB22 (Brand name) made by Sumitomo Chemical Co,. Ltd. is an example of negative resists. The chemically-amplified negative resist provides not only excellent exposure but also the adequate resolution as well as the excellent contact with the InP. The excellent exposure is resultant from chemically amplifying a negative resist. This enables reduction of the EB lithography time. Also, it is to be the negative resist's advantage that the Deep UV exposure can be eliminated despite the need of conducting the double exposure via EB exposure and Deep UV in the case of using a positive resist.

When integrating a DFB-LD and optical modulator in the form of a monolithic, it is required to carry out the patterning so that said resist may be left to be a diffraction grating in the DFB-LDP but may not be in the modulator. In the case of using a positive resist, the optical modulator section is required to be coated via the ED lithography or exposed via the Deep UV for which a lot of time is required, but the use of the negative resist may lead to EB-expose the DFB-LD section only which results in reducing the exposure time.

Fourth Embodiment

In a fourth embodiment of the present invention, provided below the description with respect to a resist so structured that a side portion tip of the resist for each pitch is in the form of a point. Like the second embodiment of the present invention, the fourth embodiment of the present invention is different from the first embodiment in the EB lithography pattern and Deep UV pattern and the other processes (DFB-LD manufacturing processes such as resist coating, EB exposure, Deep UV exposure, development, etching, MO-VPE and LPE, etc. as shown in FIGS. 5A–5E, FIG. 8 and FIG. 9) are the same as those in the first embodiment. Accordingly, described below are the EB lithography and Deep UV exposure patterns which are different from those in the first, second and third embodiments. The description with respect to the other processes is thus omitted herein.

Figure 15:
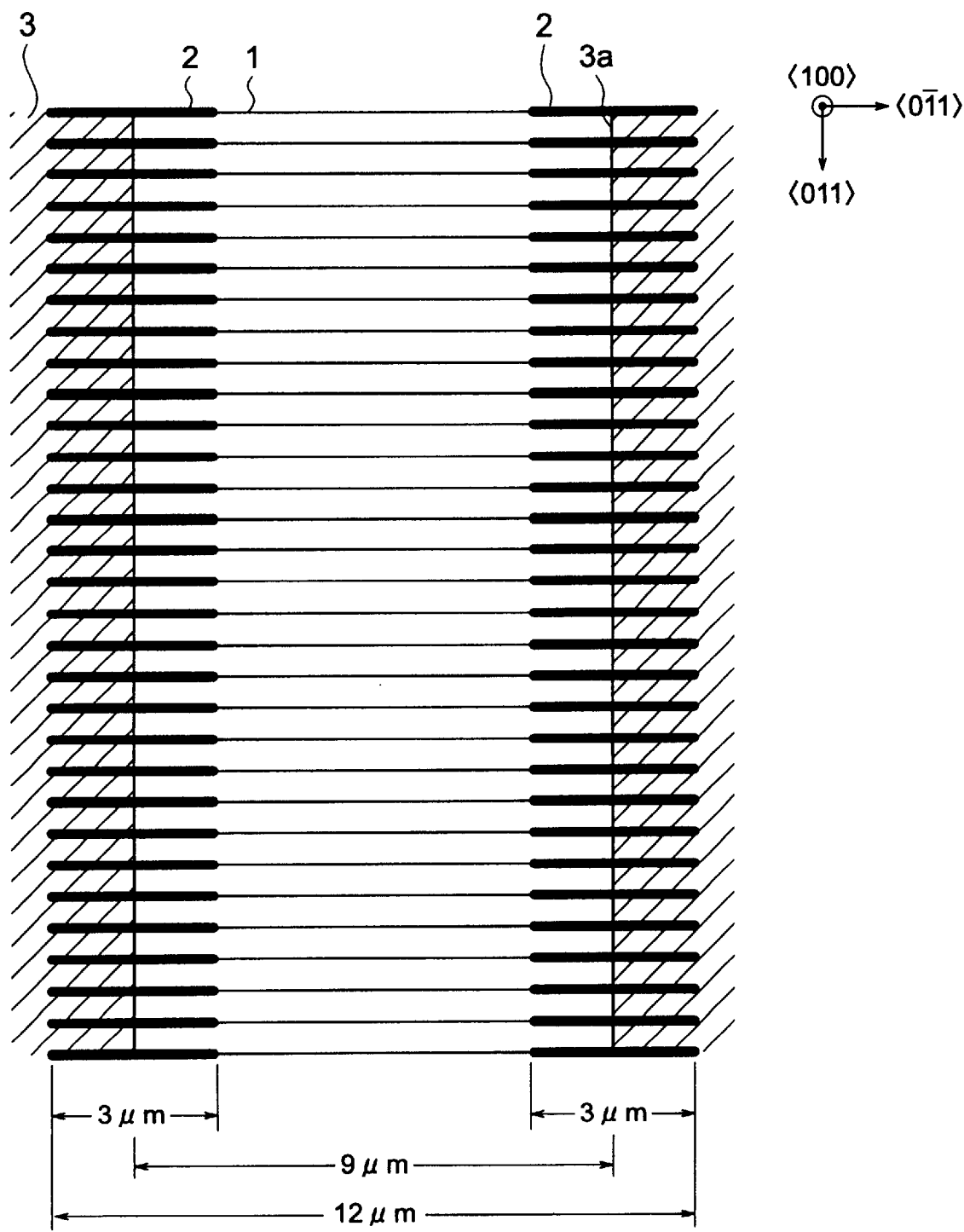
FIG. 15 shows an exposure pattern formed during the process of forming a diffraction grating in a fourth embodiment of the present invention.
Figure 16:
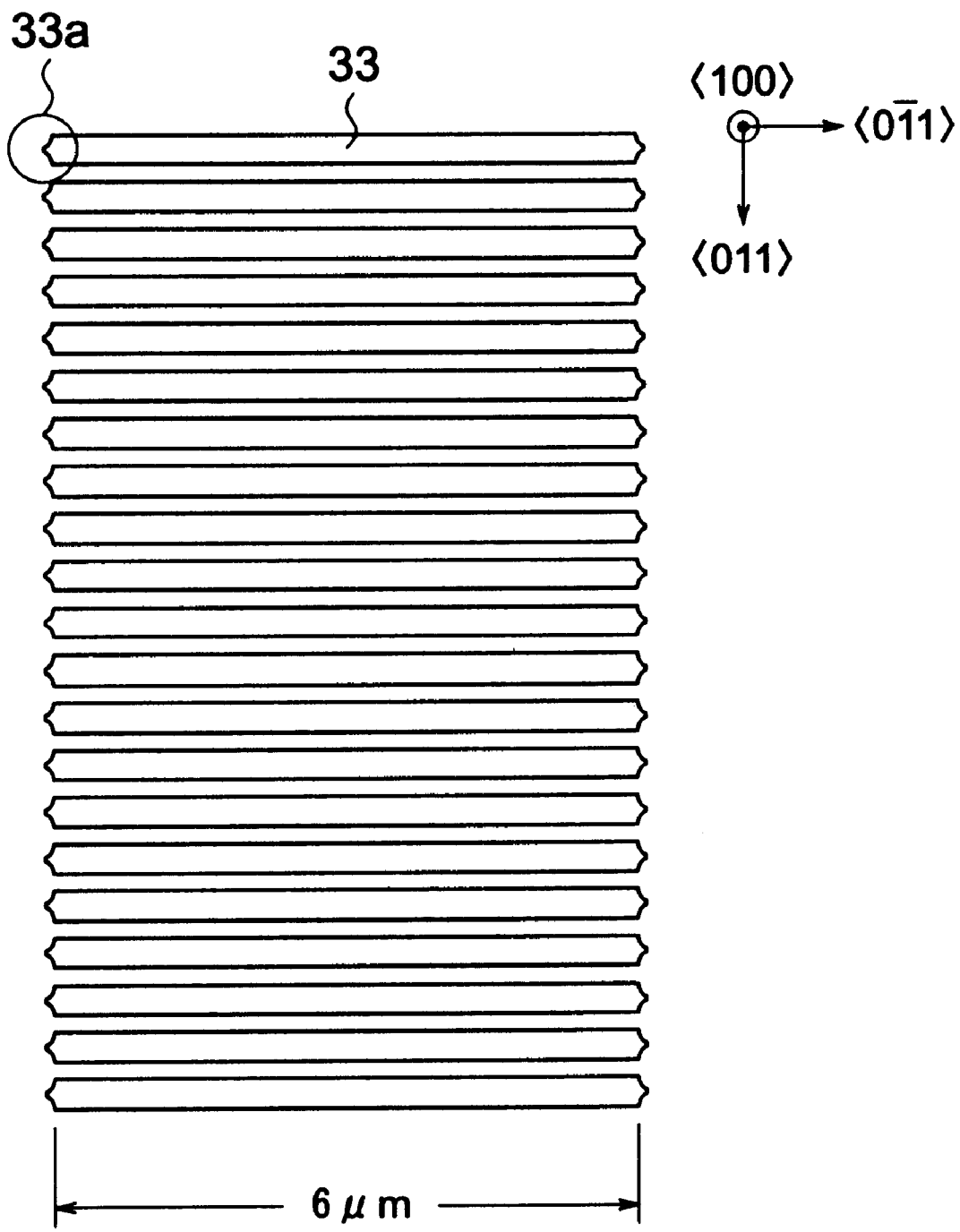
FIG. 16 shows a resist pattern formed by developing an exposure pattern as shown in FIG. 15.

According to the fourth embodiment of the present invention, after the same resist 33 as used in the first embodiment of the present invention is coated on a (100) plane of n-InP substrate (FIG. 5A), an electron beam lithography line 1 with the width of 12 μm is first patterned on the resist via EB exposure as shown in FIG. 15 and only both end portions of the electron beam line with the width of 3 μm is exposed via the EB to form a double-exposed electron beam lithography line 2 (FIG. 5B). Next, the resist 33 is exposed (FIG. 5C) via the Deep UV light 31 using the same mask as used in the second embodiment of the present invention wherein the interface with the transmitting and light shielding portions is in the form of a straight line and the width of the light shielding portion is 9 μm. A diffraction grating is formed on the InP substrate after the development (FIG. 5D) and etching (FIG. 5E) which are the same processes as those of the first embodiment of the present invention. According to the exposure of the fourth embodiment of the present invention, the resist covering both ends of the electron beam lithography line with the width of 3 μm is removed after the development thereof and a tip 33a of the resist 33 left is in the form of a point as shown in FIG. 16. The tip 33a of the resist 33 thus becomes easy to be under-etched at time of the wet-etching and the etched shape is loosened. This not only achieves an object of the preset invention but also can align the composition change position slightly caused on a semiconductor layer of the substrate in accordance with the fourth embodiment of the present invention since unlike the first embodiment of the present invention, each tip of the resists is aligned (not in the form of a zigzag). As a result, if the composition change position is disposed in a channel (groove) of the DC-PBH structure, said composition change position is removed at time of forming channels. This generates the synergetic effect to reduce the laser characteristics changing factors.

After the resist is developed, formed in their order according to the same manufacturing processes as those of the first embodiment are a diffraction grating 6, a n-InGaAsP guide layer 8, a n-InP spacer layer 9, a n-InGaAsP SCH layer 10, a strained MQW active layer 11, an InGaAsP SCH layer 12, a p-InP clad layer 13, two channels between which a stripe active region is disposed, a p-InP block layer 14, a n-InP block layer 15, a p-InP buried layer 16, a p-InGaAsP contact layer 17, a SiO$_2$ film 18 with a stripe aperture 18a and electrodes 9a and 19b. Each of said electrodes is cleaved into each chip. A DC-PBH type DFB-LD with the same semiconductor-laminated structure as that of the first embodiment of the present invention is complete with the manufacturing process as described above.

Figure 17:
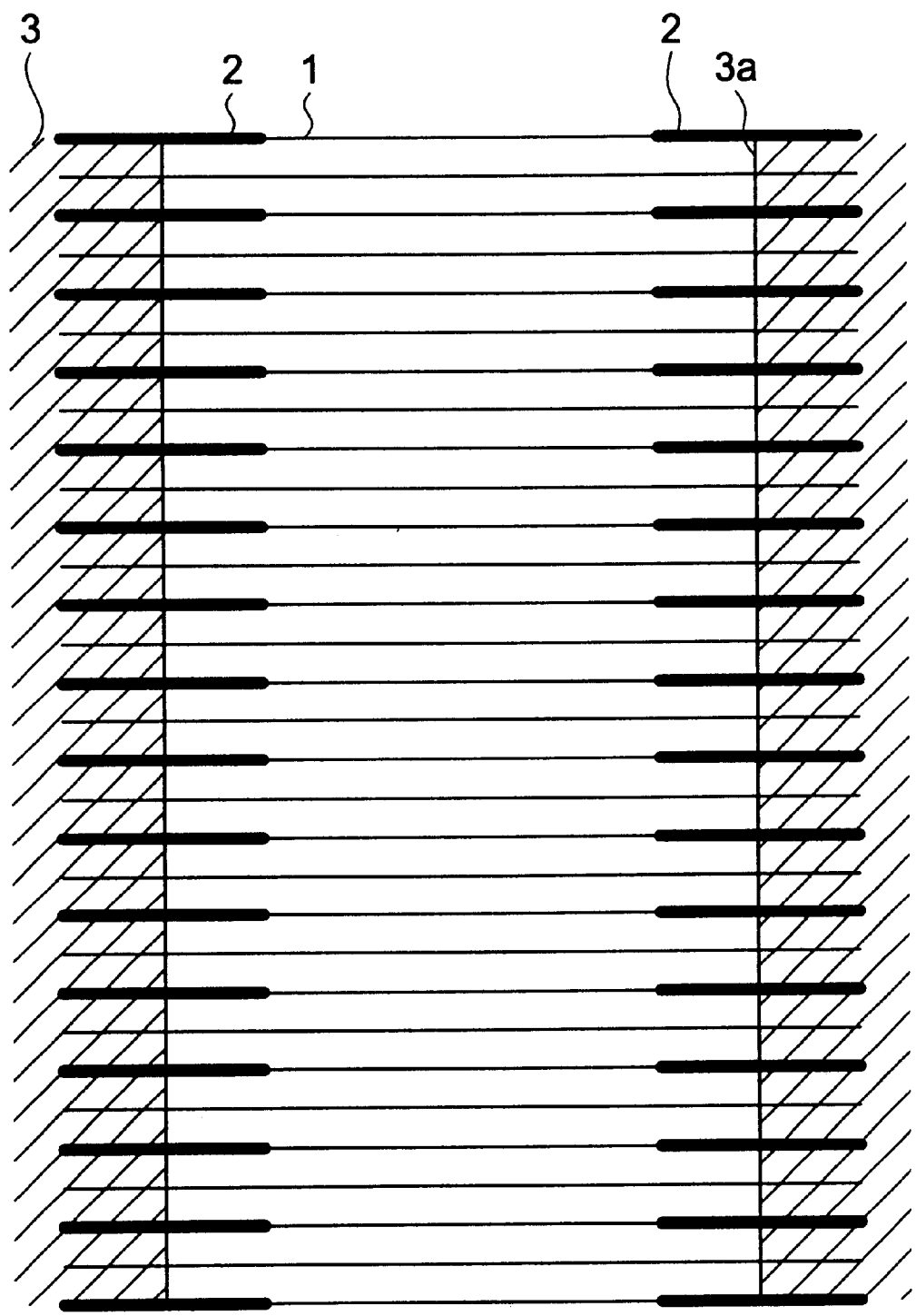
FIG. 17 shows a modified example from an exposure pattern formed during the process of forming a diffraction grating in a fourth embodiment of the present invention.
Figure 18:
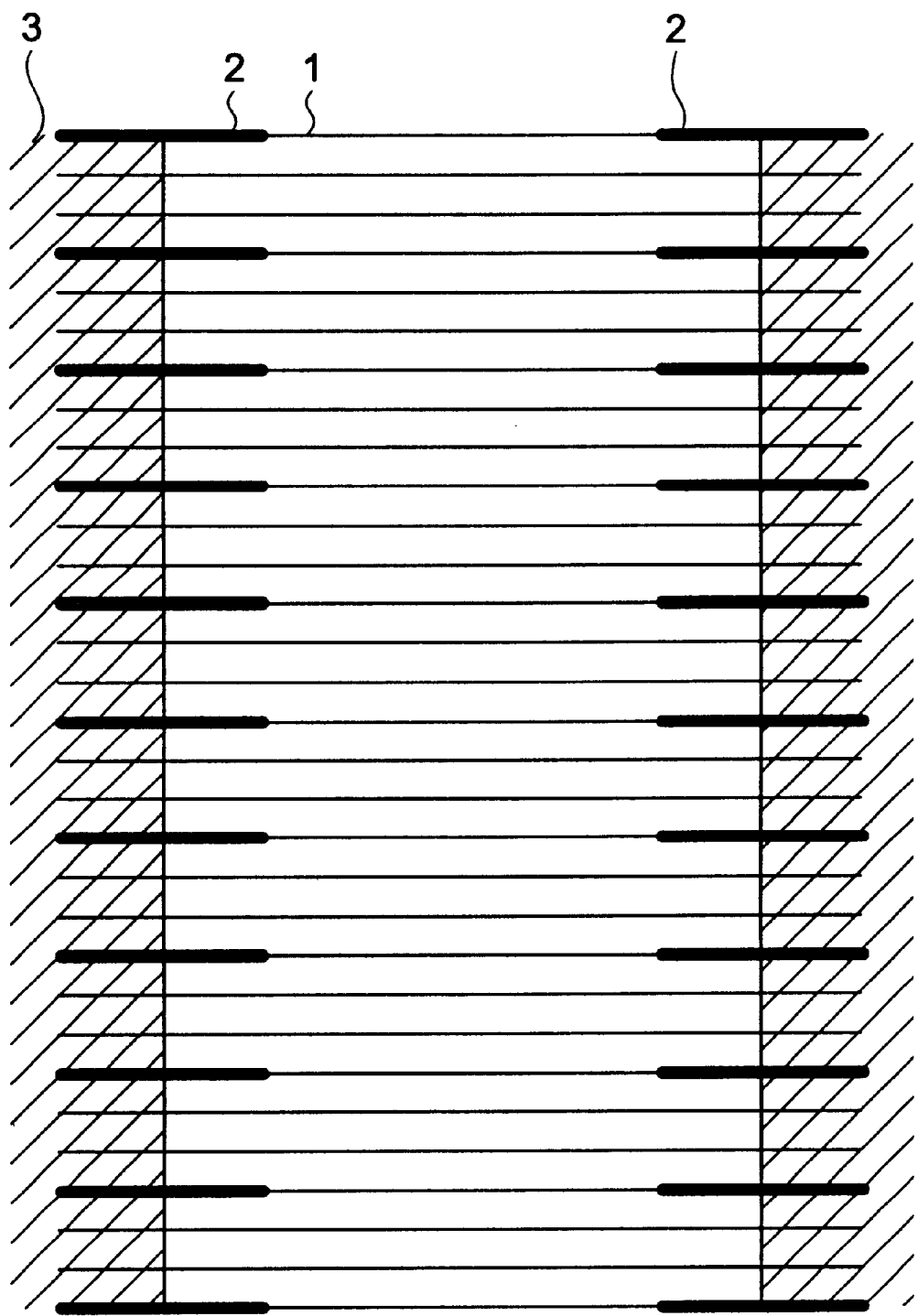
FIG. 18 shows a modified example from an exposure pattern formed during the process of forming a diffraction grating in a fourth embodiment of the present invention.
Figure 19:
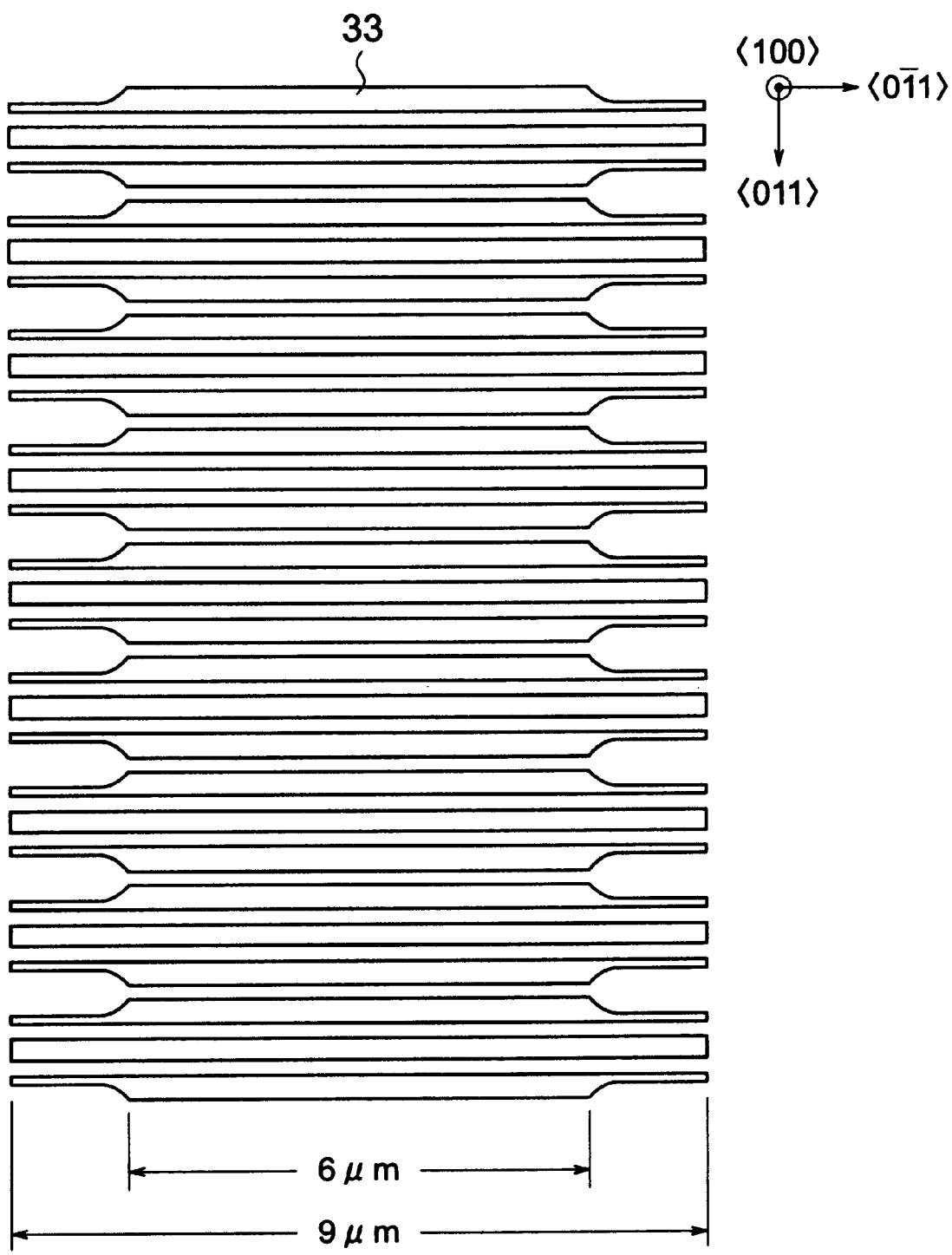
FIG. 19 shows a resist pattern formed by developing an exposure pattern as shown in FIG. 18.

A double electron beam lithography line 2 of the fourth embodiment of the present invention is formed as per each electron beam lithography line, but may be formed every second line or every third line or at several cycle intervals as shown in FIG. 17 and FIG. 18. For example, when forming a double electron beam lithography line 2 every third line (FIG. 18) or at several cycle intervals as shown in FIG. 19 (Formation of the double electron beam lithography line every third line is shown in FIG. 18), it is possible to make a tip of the resist 33 left after the development thereof to be in the form of a point and to have the average resist-coated area gradually changed simultaneously. Also, FIG. 17 and FIG. 18 respectively show an example that every electron beam lithography line 2 is formed at several cycle intervals, but several double electron beam lithography lines 2 may be formed in the form of two or three lines at several cycle intervals.

In the first to the fourth embodiments, the Deep UV exposure is carried out after the EB exposure, but the EB exposure may be conducted after the Deep UV exposure. The description with respect to the preferred embodiments of the present invention is provided herein, but it is naturally possible to make various design changes within the claims of the present invention not limiting to the embodiments thereof. For example, the combination of InGaAs/InP is adopted with respect to the material combination for an active layer/a substrate, but used are the material combinations such as (InGaAsP/GaAs), (InGaAs/GaAs), (InGaP/GaAs), (AlGaInP/GaAs), (AlGaInAs/GaAs), (AlGaInN/GaAs), (GaInNAs/GaAs), (InGaAs/InP), (InGaP/InP), (AlGaInP/InP), (AlGaInAs/InP), (GaInAsBi/InP), (AlGaInAsBi/InP), (TlInGaP/InP) and (TlInAlP/InP), etc. The material combinations as described above are selected suitable for the DC-PBH stripe structure, but may be applied to other stripe structures such as BH, BH-BOG, SBH, ridge waveguide structure and rib waveguide one, etc. A strained MQW structure is used for an active layer but a MQW without distortions or an ordinary bulk semiconductor layer may also be used therefor. Furthermore, it is possible to make said material combinations available for a DFB-LD array on which disposed are a plurality of DFB-LDs and optical integrated circuits on which a DFB-LD, an optical modulator, spot size converter and light sensing device, etc. are integrated in the form of a monolithic in addition to a single DFB-LD. Also, a current block layer is directed to be comprised of p-InP and n-InP, but may be comprised of a high resistance semiconductor layer such as Fe doped InP, etc or a semi-insulated semiconductor layer.

What is claimed is:

1. A method for manufacturing a diffraction grating comprising the steps of:

coating a resist on an entire surface of a semiconductor substrate, making electron-beam lithography of a diffraction grating pattern on a region of said resist, said diffraction grating pattern comprising parallel lines;

developing said resist so that said resist is removed from any region other than said diffraction grating forming region; and etching said semiconductor substrate using said developed resist as an etching mask to form a diffraction grating on said semiconductor substrate.

2. The method for manufacturing a diffraction grating according to claim 1, wherein edge of the resist-coated area is shaped according to a pattern.

3. The method for manufacturing a diffraction grating according to claim 1, wherein a contour of an edge of the resist left on the diffraction grating forming region is in the form of a wavy line.

4. The method for manufacturing a diffraction grating according to claim 1, wherein a contour of an edge of the resist left on the diffraction grating forming region is in the form of a zigzag.

5. The method for manufacturing a diffraction grating according to claim 1, wherein a contour of an edge of the resist left on the diffraction grating forming region has a sinusoidal shape.

6. A method for manufacturing a diffraction grating comprising the steps of:
   coating on an entire surface of a semiconductor substrate a positive resist to be exposed to both electron-beam and ultraviolet light;
   making electron-beam lithography of a diffraction grating pattern on a region of said resist, said diffraction grating pattern comprising parallel lines;
   exposing with deep ultraviolet light any region other than the electron-beam exposing region to form an interface between the deep ultraviolet exposing region and non-deep ultraviolet exposing region;
   developing said resist so that said resist is left on the diffraction grating forming region only and removed from any region other than the diffraction grating forming region; and
   etching said semiconductor substrate using said developed resist as an etching mask to form a diffraction grating on said semiconductor substrate.

7. The method for manufacturing a diffraction grating according to claim 6, wherein the interface between the deep ultraviolet exposing region and non-deep ultraviolet exposing region is in the form of a zigzag.

8. The method for manufacturing a diffraction grating according to claim 6, wherein the interface between the deep ultraviolet exposing region and non-deep ultraviolet exposing region has a sinusoidal shape.

9. A method for manufacturing a diffraction grating comprising the steps of:
   coating on an entire surface of a semiconductor substrate a positive resist to be exposed to both electron-beam and deep ultraviolet light;
   making a local electron-beam exposure of said resist to form on said resist a pattern by disposing a number of first parallel patterning lines and second parallel patterning lines, each of said second parallel patterning lines being shorter than each of said first parallel patterning lines and which are disposed between said first parallel patterning lines at several cycle intervals per said first straight patterning lines;
   exposing with deep ultraviolet light a region other than the electron-beam exposing region so that the interface between the deep ultraviolet exposing region and non-deep ultraviolet exposing region is in the form of a straight line;
   developing said resist so that said resist is left on the diffraction grating forming region only and removed from any region other than the diffraction grating forming region; and etching said semiconductor substrate using said developed resist as an etching mask to form a diffraction grating on said semiconductor substrate.

10. A method for manufacturing a diffraction grating comprising the steps of:
    coating on an entire surface of a semiconductor substrate a negative resist to be exposed to the electron beam;
    making a local electron beam exposure of said resist to form on said resist a pattern by disposing first parallel patterning lines and the second parallel patterning lines each of said second parallel patterning lines being shorter than each of said first parallel pattering lines;
    developing said resist so that said resist is left on a diffraction grating forming region only and removed from any region other than the diffraction grating forming region; and
    etching said semiconductor substrate using said developed resist as an etching mask to form a diffraction grating on said semiconductor substrate.

11. A method for manufacturing a diffraction grating comprising the steps of:
    coating on an entire surface of a semiconductor substrate a negative resist to be exposed to the electron-beam;
    making a local electron-beam exposure of said resist to form on said resist a pattern by disposing on said resist a number of first parallel patterning lines and at least one second parallel patterning line, each of said second parallel patterning lines being shorter than each of said first parallel patterning lines, and each of said second parallel patterning lines being disposed at several cycle intervals per said first parallel patterning lines;
    developing said resist so that said resist is left on a diffraction grating forming region only and removed from any region other than the diffraction grating forming region; and
    etching said semiconductor substrate using said developed resist as an etching mask to form a diffraction grating on said semiconductor substrate.

12. The method for manufacturing a diffraction grating according to claim 10, wherein a negative resist to be exposed to the electron beam is a chemically amplified negative resist.

13. A method for manufacturing a diffraction grating comprising the steps of:
    coating on an entire surface of a semiconductor substrate a positive resist to be exposed to both electron-beam and deep ultraviolet light;
    making a local electron-beam exposure of said resist to form on said resist a pattern comprising a number of parallel patterning lines both ends of which are double-exposed;
    exposing with deep ultraviolet light the region other than the electron-beam exposing region so that the interface between the deep ultraviolet exposing region and non-deep ultraviolet exposing region is in the form of a straight line;
    developing said resist so that said resist is left on a diffraction grating forming region only and removed from any region other than the diffraction grating forming region; and
    etching said semiconductor substrate using said developed resist as an etching mask to form a diffraction grating on said semiconductor substrate.

14. A method for manufacturing a diffraction grating comprising:
    coating on an entire surface of a semiconductor substrate a positive resist to be exposed to both electron-beam and deep ultraviolet light;

making a local electron-beam exposure of said resist to form on the predetermined position of said resist a pattern comprising a number of parallel patterning lines wherein both ends of at least one of said patterning lines is double-exposed;

exposing with deep ultraviolet light the region other than the electron-beam exposing region so that the interface between the deep ultraviolet exposing region and the non-deep ultraviolet exposing region is in the form of a straight line;

developing said resist so that said resist is left on a diffraction grating forming region only and removed from any region other than the diffraction grating forming region; and etching said semiconductor substrate using said developed resist as an etching mask to form a diffraction grating on said semiconductor substrate.

15. A method for manufacturing a diffraction grating comprising the steps of:

coating on an entire surface of a semiconductor substrate a positive resist to be exposed to both electron-beam and deep ultraviolet light;

making a local electron-beam exposure of said resist to form on the predetermined position of said resist a pattern comprising a number of the predetermined length of the straight parallel patterning lines wherein both ends of one or a plurality of said straight patterning lines are double-exposed at several cycle intervals per said straight patterning lines;

exposing with deep ultraviolet light the region other than the electron-beam exposing region so that the interface between the deep ultraviolet exposing region and the non-deep ultraviolet exposing region is straight;

developing said resist so that said resist is left on a diffraction grating forming region only and removed from any region other than the diffraction grating forming region; and etching said semiconductor substrate using said developed resist as an etching mask to form a diffraction grating on said semiconductor substrate.

16. A method for manufacturing a semiconductor laser comprising the steps of:

forming a diffraction grating on a region of a semiconductor substrate; and laminating and growing a semiconductor multilayer structure including an active layer on said semiconductor substrate, wherein said process of forming the diffraction grating comprises:

coating a resist on an entire surface of a semiconductor substrate;

making an electron beam lithography of a diffraction grating pattern comprising parallel pattern lines;

developing said resist so that said resist is left on a diffraction grating forming region only and removed from any region other than the diffraction grating forming region; and etching said semiconductor substrate using said developed resist as an etching mask.

17. A method for manufacturing a semiconductor laser comprising the steps of:

forming a diffraction grating on a region of a semiconductor substrate; and laminating and growing a semiconductor multilayer structure including an active layer on said semiconductor substrate, wherein said process of forming the diffraction grating comprises:

coating on an entire surface of a semiconductor substrate a positive resist to be exposed to both electron-beam and deep ultraviolet light;

making an electron-beam lithography of a diffraction grating pattern comprising parallel pattern lines which are disposed on said resist;

exposing with deep ultraviolet light any region other than the electron-beam exposing region so that the interface between the deep ultraviolet exposing region and the non-deep ultraviolet exposing region is in the form of a wavy line;

developing said resist so that said resist is left on a diffraction grating forming region only and removed from any region other than the diffraction grating forming region; and etching said semiconductor substrate using said developed resist as an etching mask.

18. A method for manufacturing a semiconductor laser comprising the steps of:

forming a diffraction grating on a region of a semiconductor substrate; and laminating and growing a semiconductor multilayer structure including an active layer on said semiconductor substrate, wherein said process of forming the diffraction grating comprises:

coating on an entire surface of a semiconductor substrate a positive resist to be exposed to both electron-beam and deep ultraviolet light;

making a electron-beam exposure of said resist to form on said resist a pattern by disposing on said resist a number of first parallel patterning lines and second parallel patterning lines, each of said second parallel patterning lines being shorter than each of said first parallel patterning lines and which are disposed between said first parallel patterning;

exposing with deep ultraviolet light any region other than the electron-beam exposing region so that the interface between the deep ultraviolet exposing region and the non-deep ultraviolet exposing region is in the form of a wavy line;

developing said resist so that said resist is left on a diffraction grating forming region only and removed from any region other than the diffraction grating forming region; and etching said semiconductor substrate using said developed resist as an etching mask.

19. A method for manufacturing a semiconductor laser comprising the steps of:

forming a diffraction grating on a region of a semiconductor substrate; and laminating and growing a semiconductor multilayer structure including an active layer on said semiconductor substrate, wherein said process of forming the diffraction grating comprises:

coating on an entire surface of a semiconductor substrate a positive resist to be exposed to the electron beam;

making a local electron-beam exposure of said resist to form on said resist a pattern by disposing in parallel on the predetermined position of said first parallel patterning lines and the second parallel patterning lines, each of said second parallel patterning lines being shorter than each of said first parallel patterning lines;

developing said resist so that said resist is left on a diffraction grating forming region only and removed from any region other than the diffraction grating forming region; and etching said semiconductor substrate using said developed resist as an etching mask.

20. A method for manufacturing a semiconductor laser comprising the steps of:

forming a diffraction grating on a region of a semiconductor substrate; and laminating and growing a semiconductor multilayer structure including an active layer on said semiconductor substrate, wherein said process of forming the diffraction grating comprises:

coating on an entire surface of a semiconductor substrate a positive resist to be exposed to the electron beam;

making a local electron-beam exposure of said resist to form on said resist a pattern by disposing on said resist a number of first parallel patterning lines second parallel patterning lines, each of said second parallel patterning lines being shorter than each of said first parallel patterning lines, and said second parallel patterning lines being disposed at several intervals per first parallel patterning lines;

developing said resist so that said resist is left on a diffraction grating forming region only and removed from any region other than the diffraction grating forming region; and etching said semiconductor substrate using said developed resist as an etching mask.

21. A method for manufacturing a semiconductor laser comprising the steps of;

forming a diffraction grating on a region of a semiconductor substrate; and laminating and growing a semiconductor multilayer structure including an active layer on said semiconductor substrate, wherein said process for forming the diffraction grating comprises the steps of:

coating on an entire surface of a semiconductor substrate a positive resist to be exposed to both electron-beam and deep ultraviolet light;

making a local electron-beam exposure of said resist to form on said resist a pattern comprising a number of parallel patterning lines both ends of which are double-exposed;

exposing with deep ultraviolet light any region other than the electron-beam exposing region so that the interface between the deep ultraviolet exposing region and the non-deep ultraviolet exposing region is in the form of a straight line;

developing said resist so that said resist is left on a diffraction grating forming region only and removed from any region other than the diffraction grating forming region; and etching said semiconductor substrate using said developed resist as an etching mask.

22. A method for manufacturing a semiconductor laser comprising the steps of:

forming a diffraction grating on a region of a semiconductor substrate; and laminating and growing a semiconductor multilayer structure including an active layer on said semiconductor substrate, wherein said process for forming the diffraction grating comprises the steps of:

coating on an entire surface of a semiconductor substrate a positive resist to be exposed to both electron-beam and deep ultraviolet light;

making a local electron-beam exposure of said resist to form on the predetermined position of said resist a pattern comprising a number of parallel patterning lines wherein both ends of one or a plurality of said parallel patterning lines are double-exposed every other line;

exposing with deep ultraviolet light any region other than the electron-beam exposing region so that the interface between the deep ultraviolet exposing region and the non-deep ultraviolet exposing region is in the form of a straight line;

developing said resist so that said resist is left on a diffraction grating forming region only and removed from any region other than the diffraction grating forming region; and etching said semiconductor substrate using said developed resist as an etching mask.

23. A method for manufacturing a semiconductor laser comprising the steps of:

forming a diffraction grating locally on a predetermined region of a semiconductor substrate; and laminating and growing a semiconductor multilayer structure including an active layer on said semiconductor substrate, wherein said process for forming the diffraction grating comprises the steps of:

coating on an entire surface of a semiconductor substrate a positive resist to be exposed to both electron-beam and deep ultraviolet light;

making a local electron-beam exposure of said resist to form on the predetermined position of said resist a pattern comprising a number of parallel patterning lines wherein both ends of one or a plurality of said parallel patterning lines are double-exposed at several cycle intervals per said parallel patterning line;

exposing with deep ultraviolet light any region other than the electron-beam exposing region so that the interface between the deep ultraviolet exposing region and the non-deep ultraviolet exposing region is in the form of a straight line;

developing said resist so that said resist is left on a diffraction grating forming region only and removed from any region other than the diffraction grating forming region; and etching said semiconductor substrate using said developed resist as an etching mask.

24. The method for manufacturing a semiconductor laser according to claim 16, wherein said laminating and growing the semiconductor multilayer structure on the substrate comprises the steps of;

forming a semiconductor multilayer structure by laminating and growing in their order a guide layer, a spacer layer, a first SCH layer, an active layer, a second SCH layer and clad layer via an organometallic vapor phase epitaxy method;

etching said semiconductor multilayer structure to form two channels disposed in parallel with said semiconductor multilayer structure and to form a stripe active region between said channels; and growing a block layer to block the current in said channels and further, to grow a buried layer and contact layer on said block layer and stripe active region in their order.

25. The method for manufacturing a semiconductor laser according to claim 17, wherein said laminating and growing the semiconductor multilayer structure on the substrate comprises the steps of;
  forming a semiconductor multilayer structure by laminating and growing in their order a guide layer, a spacer layer, a first SCH layer, an active layer, a second SCH layer and clad layer via an organometallic vapor phase epitaxy method;
  etching said semiconductor multilayer structure to form two channels disposed in parallel with said semiconductor multilayer structure and to form a stripe active region between said channels; and
  growing a block layer to block the current in said channels and further, to grow a buried layer and contact layer on said block layer and stripe active region in their order.

26. The method for manufacturing a semiconductor laser according to claim 18, wherein said laminating and growing the semiconductor multilayer structure on the substrate comprises the steps of;
  forming a semiconductor multilayer structure by laminating and growing in their order a guide layer, a spacer layer, a first SCH layer, an active layer, a second SCH layer and clad layer via an organometallic vapor phase epitaxy method;
  etching said semiconductor multilayer structure to form two channels disposed in parallel with said semiconductor multilayer structure and to form a stripe active region between said channels; and
  growing a block layer to block the current in said channels and further, to grow a buried layer and contact layer on said block layer and stripe active region in their order.

27. The method for manufacturing a semiconductor laser according to claim 19, wherein said laminating and growing the semiconductor multilayer structure on the substrate comprises the steps of;
  forming a semiconductor multilayer structure by laminating and growing in their order a guide layer, a spacer layer, a first SCH layer, an active layer, a second SCH layer and clad layer via an organometallic vapor phase epitaxy method;
  etching said semiconductor multilayer structure to form two channels disposed in parallel with said semiconductor multilayer structure and to form a stripe active region between said channels; and
  growing a block layer to block the current in said channels and further, to grow a buried layer and contact layer on said block layer and stripe active region in their order.

28. The method for manufacturing a semiconductor laser according to claim 20, wherein said laminating and growing the semiconductor multilayer structure on the substrate comprises the steps of;
  forming a semiconductor multilayer structure by laminating and growing in their order a guide layer, a spacer layer, a first SCH layer, an active layer, a second SCH layer and clad layer via an organometallic vapor phase epitaxy method;
  etching said semiconductor multilayer structure to form two channels disposed in parallel with said semiconductor multilayer structure and to form a stripe active region between said channels; and
  growing a block layer to block the current in said channels and further, to grow a buried layer and contact layer on said block layer and stripe active region in their order.

29. The method for manufacturing a semiconductor laser according to claim 21, wherein said laminating and growing the semiconductor multilayer structure on the substrate comprises the steps of;
  forming a semiconductor multilayer structure by laminating and growing in their order a guide layer, a spacer layer, a first SCH layer, an active layer, a second SCH layer and clad layer via an organometallic vapor phase epitaxy method;
  etching said semiconductor multilayer structure to form two channels disposed in parallel with said semiconductor multilayer structure and to form a stripe active region between said channels; and
  growing a block layer to block the current in said channels and further, to grow a buried layer and contact layer on said block layer and stripe active region in their order.

30. The method for manufacturing a semiconductor laser according to claim 22, wherein said laminating and growing the semiconductor multilayer structure on the substrate comprises the steps of:
  forming a semiconductor multilayer structure by laminating and growing in their order a guide layer, a spacer layer, a first SCH layer, an active layer, a second SCH layer and clad layer via an organometallic vapor phase epitaxy method;
  etching said semiconductor multilayer structure to form two channels disposed in parallel with said semiconductor multilayer structure and to form a stripe active region between said channels; and
  growing a block layer to block the current in said channels and further, to grow a buried layer and contact layer on said block layer and stripe active region in their order.

31. The method for manufacturing a semiconductor laser according to claim 23, wherein said laminating and growing the semiconductor multilayer structure on the substrate comprises the steps of;
  forming a semiconductor multilayer structure by laminating and growing in their order a guide layer, a spacer layer, a first SCH layer, an active layer, a second SCH layer and clad layer via an organometallic vapor phase epitaxy method;
  etching said semiconductor multilayer structure to form two channels disposed in parallel with said semiconductor multilayer structure and to form a stripe active region between said channels; and
  growing a block layer to block the current in said channels and further, to grow a buried layer and contact layer on said block layer and stripe active region in their order.

32. The method for manufacturing a semiconductor laser according to claim 24, wherein said semiconductor substrate is made from n-InP in the orientation of (100) plane, a guide layer from n-InGaAsP, a spacer layer from n-InP, a first SCH layer from n-InGaAsP, an active layer from a strained multi-quantum well layer, a second SCH layer from InGaAsP, a clad layer from p-InP, a block layer from a laminated structure of p-InP and n-InP, a buried layer from p-InP and contact layer from InGaAsP.

33. The method for manufacturing a semiconductor laser according to claim 25, wherein said semiconductor substrate is made from n-InP in the orientation of (100) plane, a guide layer from n-InGaAsP, a spacer layer from n-InP, a first SCH layer from n-InGaAsP, an active layer from a strained multi-quantum well layer, a second SCH layer from InGaAsP, a clad layer from p-InP, a block layer from a laminated structure of p-InP and n-InP, a buried layer from p-InP and contact layer from InGaAsP.

34. The method for manufacturing a semiconductor laser according to claim 26, wherein said semiconductor substrate is made from n-InP in the orientation of (100) plane, a guide layer from n-InGaAsP, a spacer layer from n-InP, a first SCH layer from n-InGaAsP, an active layer from a strained multi-quantum well layer, a second SCH layer from InGaAsP, a clad layer from p-InP, a block layer from a laminated structure of p-InP and n-InP, a buried layer from p-InP and contact layer from InGaAsP.

35. The method for manufacturing a semiconductor laser according to claim 27, wherein said semiconductor substrate is made from n-InP in the orientation of (100) plane, a guide layer from n-InGaAsP, a spacer layer from n-InP, a first SCH layer from n-InGaAsP, an active layer from a strained multi-quantum well layer, a second SCH layer from InGaAsP, a clad layer from p-InP, a block layer from a laminated structure of p-InP and n-InP, a buried layer from p-InP and contact layer from InGaAsP.

36. The method for manufacturing a semiconductor laser according to claim 28, wherein said semiconductor substrate is made from n-InP in the orientation of (100) plane, a guide layer from n-InGaAsP, a spacer layer from n-InP, a first SCH layer from n-InGaAsP, an active layer from a strained multi-quantum well layer, a second SCH layer from InGaAsP, a clad layer from p-InP, a block layer from a laminated structure of p-InP and n-InP, a buried layer from p-InP and contact layer from InGaAsP.

37. The method for manufacturing a semiconductor laser according to claim 29, wherein said semiconductor substrate is made from n-InP in the orientation of (100) plane, a guide layer from n-InGaAsP, a spacer layer from n-InP, a first SCH layer from n-InGaAsP, an active layer from a strained multi-quantum well layer, a second SCH layer from InGaAsP, a clad layer from p-InP, a block layer from a laminated structure of p-InP and n-InP, a buried layer from p-InP and contact layer from InGaAsP.

38. The method for manufacturing a semiconductor laser according to claim 30, wherein said semiconductor substrate is made from n-InP in the orientation of (100) plane, a guide layer from n-InGaAsP, a spacer layer from n-InP, a first SCH layer from n-InGaAsP, an active layer from a strained multi-quantum well layer, a second SCH layer from InGaAsP, a clad layer from p-InP, a block layer from a laminated structure of p-InP and n-InP, a buried layer from p-InP and contact layer from InGaAsP.

39. The method for manufacturing a semiconductor laser according to claim 31, wherein said semiconductor substrate is made from n-InP in the orientation of (100) plane, a guide layer from n-InGaAsP, a spacer layer from n-InP, a first SCH layer from n-InGaAsP, an active layer from a strained multi-quantum well layer, a second SCH layer from InGaAsP, a clad layer from p-InP, a block layer from a laminated structure of p-InP and n-InP, a buried layer from p-InP and contact layer from InGaAsP.

40. The method for manufacturing a diffraction grating according to claim 6, wherein the interface between the ultraviolet exposing region and non-ultraviolet exposing region is in the form of a straight line.

41. The method for manufacturing a diffraction grating according to claim 6, wherein the interface between the ultraviolet exposing region and non-ultraviolet exposing region is in the form of a wavy line.

* * * * *